(12) United States Patent
Chung et al.

(10) Patent No.: US 9,570,531 B2
(45) Date of Patent: Feb. 14, 2017

(54) POWER LINES DISPOSED IN ORGANIC LIGHT EMITTING DISPLAY DEVICE

(71) Applicant: Samsung Display Co., LTD., Yongin, Gyeonggi-Do (KR)

(72) Inventors: Kyung Hoon Chung, Yongin-si (KR); Chul-Kyu Kang, Suwon-si (KR); Jung-Mi Choi, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 15 days.

(21) Appl. No.: 14/628,152

(22) Filed: Feb. 20, 2015

(65) Prior Publication Data
US 2016/0099299 A1     Apr. 7, 2016

(30) Foreign Application Priority Data
Oct. 1, 2014    (KR) .................... 10-2014-0132149

(51) Int. Cl.
*H01L 27/32*     (2006.01)
*H01L 51/52*     (2006.01)
(Continued)

(52) U.S. Cl.
CPC ....... *H01L 27/3276* (2013.01); *H01L 27/3248* (2013.01); *H01L 27/3258* (2013.01);
(Continued)

(58) Field of Classification Search
CPC ............. H01L 27/3276; H01L 27/3262; H01L 29/41733; H01L 27/3258; H01L 29/4908; H01L 29/42384; H01L 27/3248; H01L 51/5246
See application file for complete search history.

(56) References Cited

U.S. PATENT DOCUMENTS

2005/0200270 A1*  9/2005  Kwak ................. H01L 27/3276
                                                         313/502
2007/0216613 A1    9/2007  Ogura et al.
(Continued)

FOREIGN PATENT DOCUMENTS

KR     10-2007-0093906 A    9/2007
KR        10-0830981 B1     5/2008
(Continued)

*Primary Examiner* — John P Dulka
*Assistant Examiner* — Charles R Peters
(74) *Attorney, Agent, or Firm* — Knobbe Martens Olson & Bear LLP

(57) ABSTRACT

An organic light emitting display device includes a substrate comprising a major surface; a display region and a peripheral region surrounding the display region when viewed in a viewing direction perpendicular to the major surface; an array of a plurality of pixels disposed in the display region; and a first power line extending from the peripheral region into the display region, the first power line being electrically connected to the array of pixels at a contact point in the display region. When viewed in the viewing direction, the first power line includes: a first extension extending from the peripheral region to the display region; and a second extension connected to the first extension; and a third extension connected to the second extension and extending from a location in the display region toward the peripheral region.

19 Claims, 16 Drawing Sheets

(51) Int. Cl.
*H01L 29/49* (2006.01)
*H01L 29/417* (2006.01)
*H01L 29/423* (2006.01)

(52) U.S. Cl.
CPC .... *H01L 27/3262* (2013.01); *H01L 29/41733* (2013.01); *H01L 29/42384* (2013.01); *H01L 29/4908* (2013.01); *H01L 51/5246* (2013.01)

(56) References Cited

U.S. PATENT DOCUMENTS

2008/0252203 A1   10/2008  Lee
2016/0064465 A1*  3/2016  Oh ..................... H01L 27/3262
                                                                                                                  257/43

FOREIGN PATENT DOCUMENTS

| KR | 2014-0068677 A | 6/2014 |
| KR | 2014-0085980 A | 7/2014 |
| KR | 10-2015-0140513 A | 12/2015 |
| KR | 10-2016-0006839 A | 1/2016 |

* cited by examiner

A FIRST DIRECTION
A SECOND DIRECTION ⟵ A FOURTH DIRECTION
A THIRD DIRECTION

A SECOND DIRECTION
A THIRD DIRECTION ——⊗—— A FIRST DIRECTION

A SECOND DIRECTION
A THIRD DIRECTION ——⊗—— A FIRST DIRECTION

A FOURTH DIRECTION
A THIRD DIRECTION ←—⊙—→ A FIRST DIRECTION

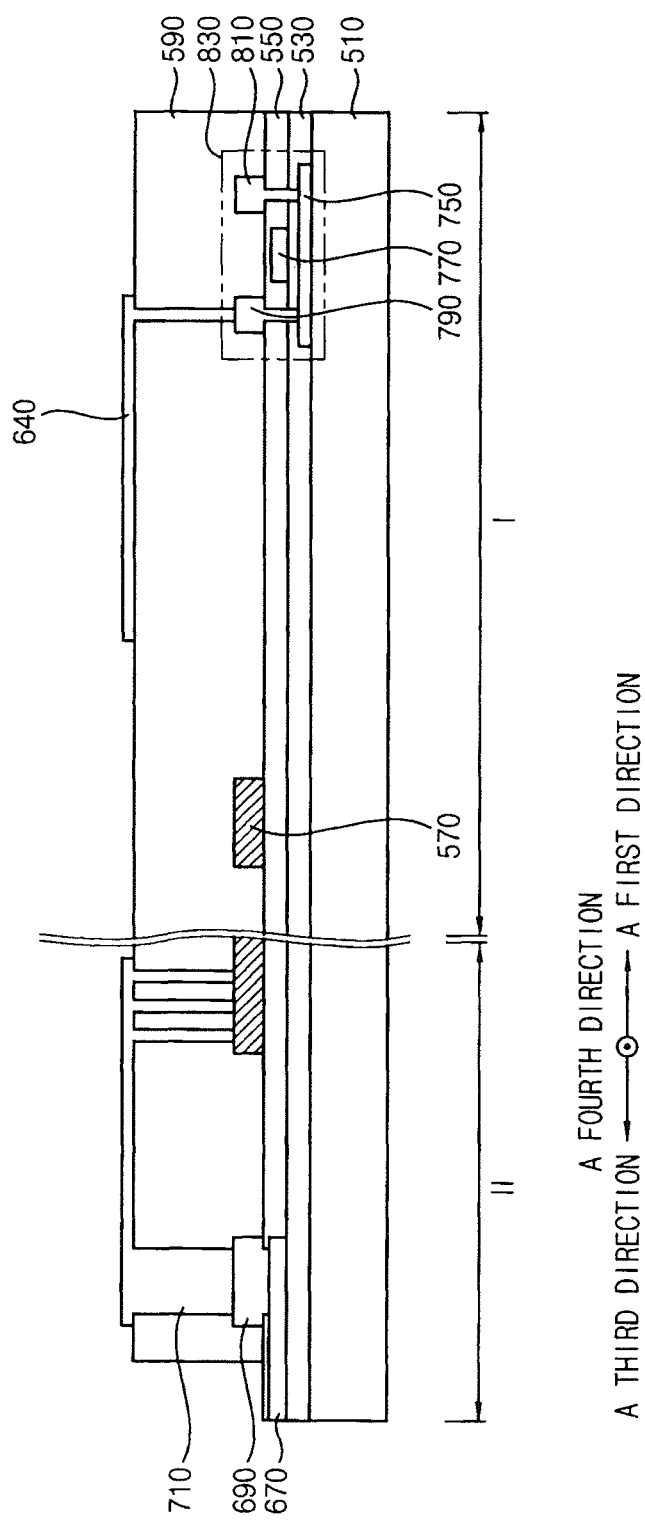

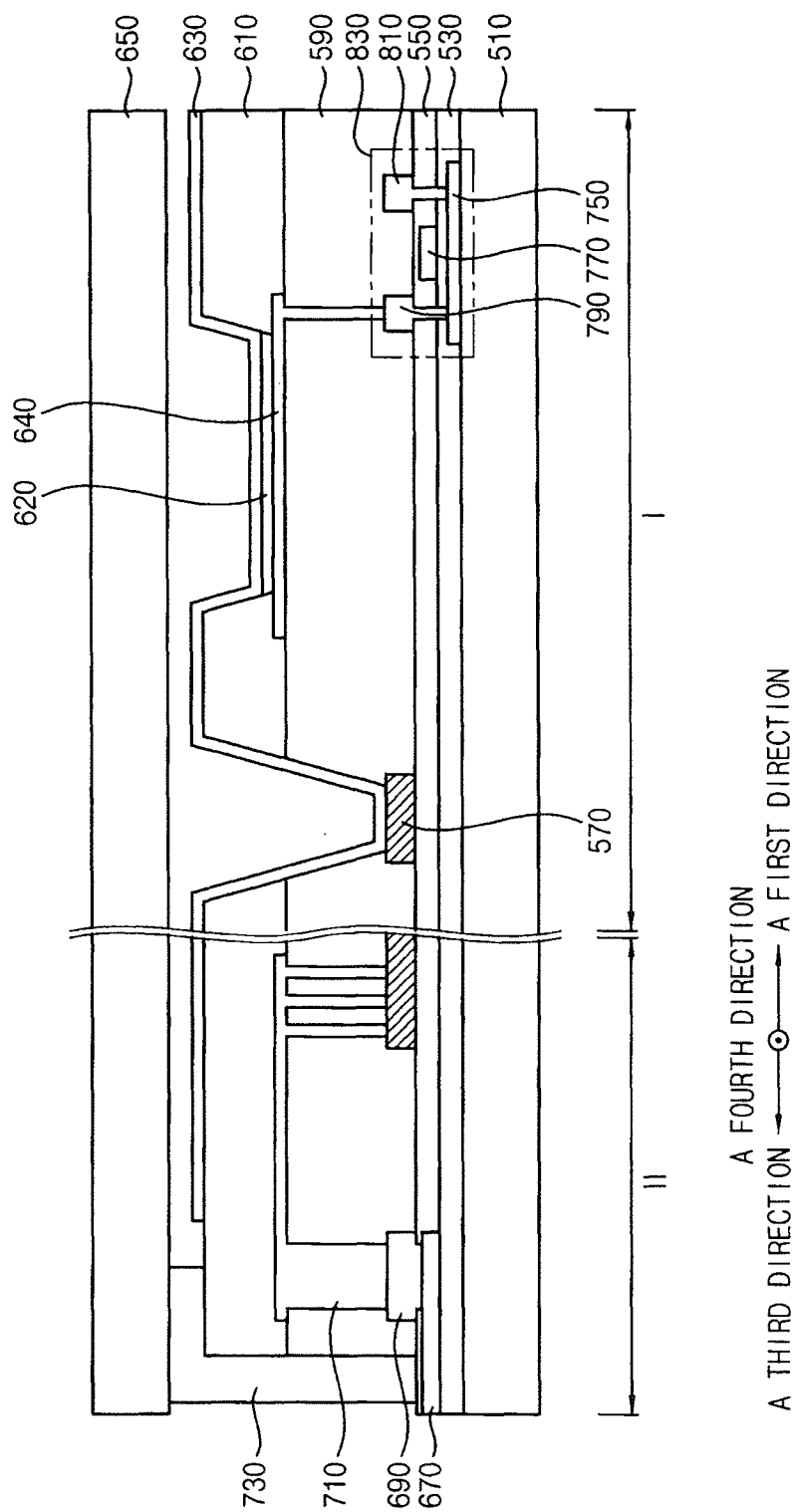

A SECOND DIRECTION
A THIRD DIRECTION ←—⊗—→ A FIRST DIRECTION

A SECOND DIRECTION
A THIRD DIRECTION ←—⊗—→ A FIRST DIRECTION

POWER LINES DISPOSED IN ORGANIC LIGHT EMITTING DISPLAY DEVICE

CROSS-REFERENCE TO RELATED APPLICATION(S)

This application claims priority under 35 USC §119 to Korean Patent Applications No. 10-2014-0132149, filed on Oct. 1, 2014 in the Korean Intellectual Property Office (KIPO), the contents of which are incorporated herein in its entirety by reference.

BACKGROUND

1. Technical Field

Example embodiments relate generally to organic light emitting display devices. More particularly, embodiments of the present inventive concept relate to organic light emitting diode display devices including a power line.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted. As the OLED device becomes larger, an IR drop or voltage drop of a power supply voltage has become intensified in a display region of the OLED device.

SUMMARY

Some example embodiments provide an organic light emitting display device including a display region having a uniform luminance using a second electrode and a first power line.

One aspect provides an organic light emitting display device, comprising: a substrate comprising a major surface; a display region and a peripheral region surrounding the display region when viewed in a viewing direction perpendicular to the major surface; an array of a plurality of pixels disposed in the display region; and a first power line extending from the peripheral region into the display region, the first power line being electrically connected to the array of pixels at a contact point in the display region, wherein, when viewed in the viewing direction, the first power line comprises: a first extension extending from the peripheral region to the display region; and a second extension connected to the first extension; and a third extension connected to the second extension and extending from a location in the display region toward the peripheral region.

In the foregoing device, the first through third extensions of the first power line may be disposed at the same level, and are integrally formed, wherein the third extension may comprise one end which is not connected to a conductive line located in the same level, wherein the first extension and the third extension are substantially parallel to each other. The first power line may be connected to a power such that after a power supply voltage is transferred to a center of the display region via the first extension extending in a first direction, the power supply voltage is transferred via the third extension extending in a third direction from the center of the display region to the peripheral region. At least one of the pixels may be located between the first extension and the third extension when viewed in the viewing direction. Each of the pixels may include a first electrode disposed in the display region of the substrate; a light emitting layer disposed on the first electrode; a second electrode disposed on the light emitting layer; and at least one insulation layer interposed between the first power line and the second electrode, wherein the second electrode extends through a through-hole formed through the at least one insulation layer and contacts the first power line at the contact point. The first power line may comprise a fourth extension connected to and protruded from the third extension when viewed in the viewing direction, and the fourth extension comprises the contact point, wherein the first through third extensions are electrically connected to the second electrode via the fourth extension.

Still in the foregoing device, the first power line may further comprise a fourth extension connected to and protruded from the third extension when viewed in the viewing direction, wherein the fourth extension comprises the contact point. The third extension may comprise the contact point, wherein the first and second extensions are electrically connected to the pixels via the third extension. The organic light emitting display device may further comprise: a semiconductor element electrically connected to the pixel, wherein the semiconductor element includes at least one insulation layer, a gate electrode, an active layer, a source electrode, and a drain electrode. The organic light emitting display device may further comprise: a first connection line disposed on the substrate of the peripheral region, wherein the first connection line and the gate electrode are disposed at the same level, and wherein the first connection line and the gate electrode include the same materials. The organic light emitting display device may further comprise: a second connection line disposed on the first connection line in the peripheral region, wherein the second connection line, the source electrode, and the drain electrode are disposed at the same level, and wherein the second connection line, the source electrode, and the drain electrode include the same materials. The organic light emitting display device may further comprise: a third connection line disposed on the second connection line of the peripheral region, wherein the third connection line and the first electrode are disposed at the same level, and wherein the third connection line and the first electrode include the same materials. The third connection line and at least a portion of the first extension of the first power line may be electrically connected via an opening located in the at least one insulation layer. The organic light emitting display device may further comprise: an encapsulation substrate disposed over the pixels; and a sealant interconnecting the substrate and the encapsulation substrate.

Yet in the foregoing device, the substrate comprises a first edge and a second edge opposite to the first edge, wherein the array comprises a middle portion and peripheral portions, each of which is disposed between the middle portion and one of the first and second edges when viewed in the viewing direction, wherein the array comprises a plurality of pixel electrodes, a common electrode and a plurality of light emitting elements, each of which is disposed between one of the plurality of pixel electrodes and the common electrode, wherein the first power line may be connected to a first power terminal located between the first edge and the array, and further connected to the common electrode at the contact point which is located generally in the middle portion of the array when viewed in the viewing direction, wherein the organic light emitting display device comprises a plurality of second power lines connected to second power terminals, each of which is disposed between the array and one of the first and second edges, the plurality of second power lines being connected to the plurality of pixel electrodes.

Further in the foregoing device, the first power line may comprise another contact point located in one of the peripheral portions of the array when viewed in the viewing direction. The organic light emitting display device may further comprise additional first power lines, each of which has a contact point in the middle portion of the array. Pixels located in the middle portion may have a luminance greater than that of pixels located in the peripheral portions. When viewed in the viewing direction, the third extension may comprise one end which is not connected to any conductive line or terminal. When viewed in the viewing direction, the third extension may extend from the middle portion to one of the peripheral portions.

According to one aspect of example embodiments, an organic light emitting display device includes a substrate, a plurality of pixels, and a first power line. The substrate includes a display region and a peripheral region. The pixels are disposed in the display region of the substrate. The first power line is disposed in the peripheral region of the substrate. The first power line extends into the display region. The first power line is electrically connected to the pixels in the display region. The first power line includes a first extension, a second extension, and a third extension. The first extension is disposed along a first direction from the peripheral region to the display region. The second extension is disposed along a second direction that is perpendicular to the first direction. The third extension is disposed along a third direction that is perpendicular to the second direction.

In example embodiments, the first through third extensions of the first power line may be disposed at the same level, and may be integrally formed.

In example embodiments, the first extension and the third extension may be paralleled to each other.

In example embodiments, after a power supply voltage is transferred to a center of the display region via the first power line in the first direction, the power supply voltage may be transferred in the third direction from the center of the display region to the peripheral region via the first power line.

In example embodiments, the organic light emitting display device may further include a fourth extension disposed along a fourth direction or the second direction in the third extension of the first power line.

In example embodiments, the fourth direction may be opposite to the second direction.

In example embodiments, the fourth extension may be paralleled to the second extension, and may be spaced apart from the first extension.

In example embodiments, the pixels may be located between the first extension and the third extension.

In example embodiments, each of the pixels may include a first electrode disposed in the display region of the substrate, a light emitting layer disposed on the first electrode, and a second electrode disposed on the light emitting layer.

In example embodiments, the organic light emitting display device may further include at least one insulating layer interposed between the first power line and the second electrode.

In example embodiments, the at least one insulating layer may include an opening that exposes a portion of the first power line.

In example embodiments, the second electrode and the fourth extension of the first power line may be electrically connected via the opening.

In example embodiments, the first through third extensions of the first power line may be electrically connected to the second electrode via the fourth extension.

In example embodiments, the third extension may be electrically connected to the pixels.

In example embodiments, the first and second extensions may be electrically connected to the pixels via the third extension.

In example embodiments, the organic light emitting display device may further include a semiconductor element electrically connected to the pixel.

In example embodiments, the semiconductor element may include at least one insulating layer, a gate electrode, an active layer, a source electrode, and a drain electrode.

In example embodiments, the organic light emitting display device may further include a first connection line disposed on the substrate of the peripheral region.

In example embodiments, the first connection line and the gate electrode may be disposed at the same level.

In example embodiments, the first connection line and the gate electrode may include the same materials, and may be simultaneously formed.

In example embodiments, the organic light emitting display device may further include a second connection line disposed on the first connection line of the peripheral region.

In example embodiments, the second connection line, the source electrode, and the drain electrode may be disposed at the same level.

In example embodiments, the second connection line, the source electrode, and the drain electrode may include the same materials, and may be simultaneously formed.

In example embodiments, the organic light emitting display device may further include a third connection line disposed on the second connection line of the peripheral region.

In example embodiments, the third connection line and the first electrode may be disposed at the same level.

In example embodiments, the third connection line and the first electrode may include the same materials, and may be simultaneously formed.

In example embodiments, the third connection line and at least a portion of the first extension of the first power line may be electrically connected via an opening locating in at least a portion of the at least one insulating layer.

In example embodiments, the organic light emitting display device may further include an encapsulation substrate disposed on the pixels and a sealant sealing the substrate and the encapsulation substrate.

As an organic light emitting display device according to example embodiments includes a second electrode and a first power line, the organic light emitting display device may have a display region in which a uniform luminance is provided.

BRIEF DESCRIPTION OF THE DRAWINGS

Example embodiments can be understood in more detail from the following description taken in conjunction with the accompanying drawings, in which:

FIGS. 10A through 10H are cross sectional views illustrating a method of manufacturing an organic light emitting display device in accordance with example embodiments;

DETAILED DESCRIPTION OF THE EMBODIMENTS

Hereinafter, embodiments of the present inventive concept will be explained in detail with reference to the accompanying drawings.

As the OLED device becomes larger, an IR drop or voltage drop of a power supply voltage has become intensified in a display region of the OLED device. In order to reduce the IR drop, a dual bank method display device where a power supply unit and a data driving unit are located in both sides of the display panel has been developed. However, even in case of the dual bank method display device, luminance may be gradually reduced from a top portion and a bottom portion of the display panel to a center region of the display panel. In this case, an image sticking phenomenon may occur in the top and bottom portions of the display region, and the top and bottom portions of the display region may be easily deteriorated. Further, compared to a single bank method, the dual bank method OLED display device may include many components (e.g., the data driving unit and the power supply unit). Thus, a manufacturing cost may be increased, and a dead space may be increased.

Figure 1:
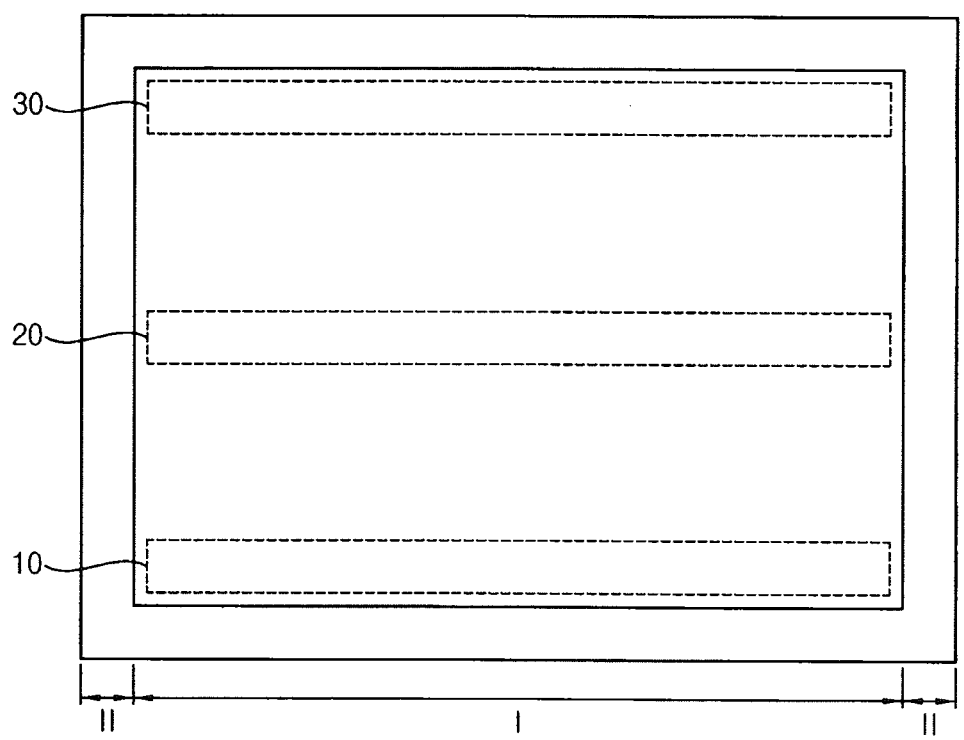
FIG. 1 is a block diagram illustrating an organic light emitting display device.

FIG. 1 is a block diagram illustrating an organic light emitting display device.

Referring to FIG. 1, an organic light emitting display (OLED) device may include a display region I and a peripheral region II. For example, an array of pixels of a display panel may be located in the display region I. The peripheral region II may surround the display region I, and may be dead space. In example embodiments, the array of the display region I may include a first portion 10 (e.g., bottom portion), a center portion or a middle portion 20, and a second portion 30 (e.g., top portion). For example, the first portion 10 and the second portion 30 may be substantially located opposite to each other. The center portion 20 may be located between the first portion 10 and the second portion 30. In addition, a power supply unit may be located adjacent to the first portion 10 and/or the center portion 20. Here, the power supply unit may provide a power supply voltage (e.g., a high power supply voltage ELVDD and a low power supply voltage ELVSS) to pixels located in the display region I. In embodiments, as illustrated in FIG. 1, the middle portion 20 may be a band of the pixels located generally in the middle of the top and bottom ends of the array and extends along the top and bottom ends of the array. In one embodiment, the width of the middle portion may be about 10% of the distance of the top and bottom ends of the array. In some embodiments, the width of the middle portion may be about 1%, about 1.5%, about 2%, about 3%, about 4%, about 5%, about 6%, about 7%, about 9%, about 12%, about 15%, about 20% and about 30% of the distance of the top and bottom ends of the array. In other embodiments, the width of the middle portion may be a ratio with respect to the distance of the top and bottom ends of the array which is between two of the above values.

Figure 2:
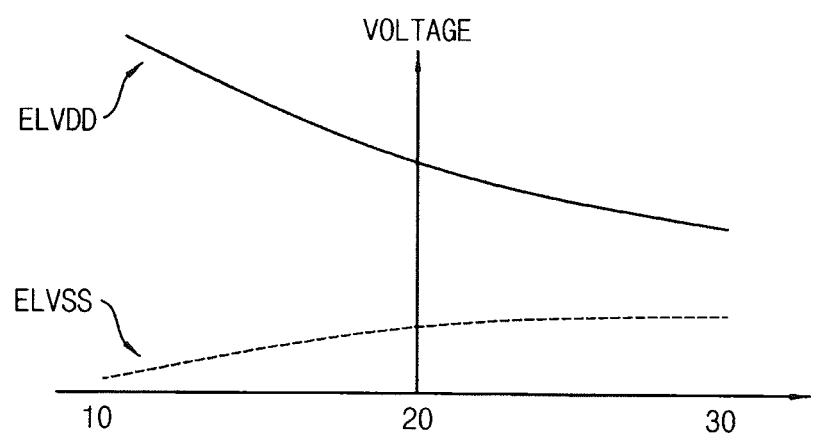
FIG. 2 is a graph illustrating an example of a high power supply voltage and a low power supply voltage when the display panel is driven by a single bank method.

FIG. 2 is a graph illustrating an example of a high power supply voltage and a low power supply voltage when the display panel is driven by a single bank method. A vertical axis of FIG. 2 is a magnitude of a voltage level, and a horizontal axis is a first portion 10, a center portion 20, and a second portion 30 of a display region I illustrated in FIG. 1.

Referring to FIG. 2, when an organic light emitting display (OLED) device is driven by a single bank method, a power supply unit may be located adjacent to the first portion 10 (or the second portion 30) of a display region I. In this case, a high power supply voltage ELVDD may be applied to the first portion 10 of the display region I through a power supply terminal which is located between the first portion 10 and a bottom edge of the substrate. Here, a voltage level of the high power supply voltage ELVDD provided from the power supply unit located adjacent to the first portion 10 of the display region I may be decreased by an IR drop because the high power supply voltage ELVDD is passed from the first portion 10 to the second portion 30 through the center portion 20. Meanwhile, a low power supply voltage ELVSS may be applied to the first portion 10 of the display region I through another power supply terminal which is located between the first portion 10 and the bottom edge of the substrate. Here, a voltage level of the low power supply voltage ELVSS provided from the power supply unit located adjacent to the first portion 10 of the display region I may be increased by the IR drop because the low power supply voltage ELVSS is passed from the first portion 10 to the second portion 30 through the center portion 20. For example, when the OLED device is driven by a digital driving method, a difference of the high power supply voltage ELVDD and the low power supply voltage ELVSS may be defined as a luminance. As illustrated in FIG. 2, a long range uniformity (LRU) of the display region I may be substantially reduced, considering the difference of the high power supply voltage ELVDD and the low power supply voltage ELVSS. That is, a luminance of the first portion 10 of the display region I may be high, and the luminance may be gradually low toward a direction from the first portion 10 to the second portion 30. However, compared to a dual bank method, the single bank method may reduce a dead space. As the OLED device becomes larger, the phenomenon may seriously occur.

Figure 3:
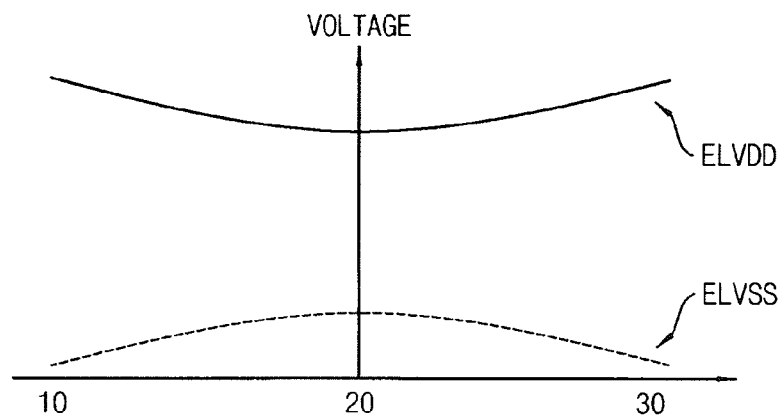
FIG. 3 is a graph illustrating an example of a high power supply voltage and a low power supply voltage when the display panel is driven by a dual bank method.

FIG. 3 is a graph illustrating an example of a high power supply voltage and a low power supply voltage when the display panel is driven by a dual bank method. A vertical axis of FIG. 3 is a magnitude of a voltage level, and a horizontal axis is a first portion 10, a center portion 20, and a second portion 30 of a display region I illustrated in FIG. 1.

Referring to FIG. 3, when an organic light emitting display (OLED) device is driven by a dual bank method, two power supply units (e.g., first and second power supply units) may be located adjacent to the first portion 10 and the second portion 30 of a display region I, respectively. In this case, a high power supply voltage ELVDD may be simultaneously applied to the first portion 10 and the second portion 30 through a first power supply terminal located between the first portion 10 and the bottom edge of the substrate and a second power supply terminal located between the first portion 10 and the top edge of the substrate. Here, a voltage level of the high power supply voltage ELVDD provided in the first power supply unit located adjacent to the second portion 30 of the display region I may be decreased by an IR drop because the high power supply voltage ELVDD is passed from the second portion 30 to the center portion 20. In similar, a voltage level of the high power supply voltage ELVDD provided in the second power supply unit located adjacent to the first portion 10 of the display region I may be decreased by an IR drop because the high power supply voltage ELVDD is passed from the first portion 10 to the center portion 20. Meanwhile, a low power supply voltage ELVSS may be simultaneously applied to the first portion 10 and the second portion 30 of the display region I through a third power supply terminal located between the first portion 10 and the bottom edge of the substrate and a fourth power supply terminal located between the first portion 10 and the top edge of the substrate. Here, a voltage level of the low power supply voltage ELVSS provided in the first power supply unit located adjacent to the second portion 30 of the display region I may be increased by an IR drop because the low power supply voltage ELVSS is passed from the second portion 30 to the center portion 20. In similar, a voltage level of the low power supply voltage ELVSS provided in the second power supply unit located adjacent to the first portion 10 of the display region I may be increased by an IR drop because the low power supply voltage ELVSS is passed from the first portion 10 to the center portion 20. When the OLED device is driven by a digital driving method, a difference of the high power supply voltage ELVDD and the low power supply voltage ELVSS may be defined as a luminance.

As illustrated in FIG. 3, in embodiments, a luminance of the first portion 10 of the display region I and the second portion 30 of the display region I may be high, and a luminance of the center portion 20 of the display region I may be low, considering the difference of the high power supply voltage ELVDD and the low power supply voltage ELVSS. Compared to a single bank method illustrated in FIG. 2, an LRU of the display region I may be relatively improved. However, an afterimage of an image sticking pattern (e.g., a logo of a broadcaster etc.) may be remained.

In addition, a voltage level applied to the first portion 10 of the display region I and the second portion 30 of the display region I may be higher than a voltage level applied to the center portion 20 of the display region I. Thus, compared to the center portion 20, components located in the first portion 10 and the second portion 30 may be quickly deteriorated. Further, when a user of the OLED device may watch a widescreen movie film, the first and second portions 10 and 30 which are high luminance regions may be unused and display black color. The center portion 20 which is a low luminance region may display an image. Thus, in this case, the OLED device may be inefficiently operated. Furthermore, the dual bank method OLED device may include many components such as additional power supply units, additional data driving units, etc. A manufacturing cost of the OLED device may be increased. In addition, when the many components are added to the OLED device, a dead space of the OLED device may be increased. As the OLED device becomes larger, the phenomenon may seriously occur.

Figure 4:
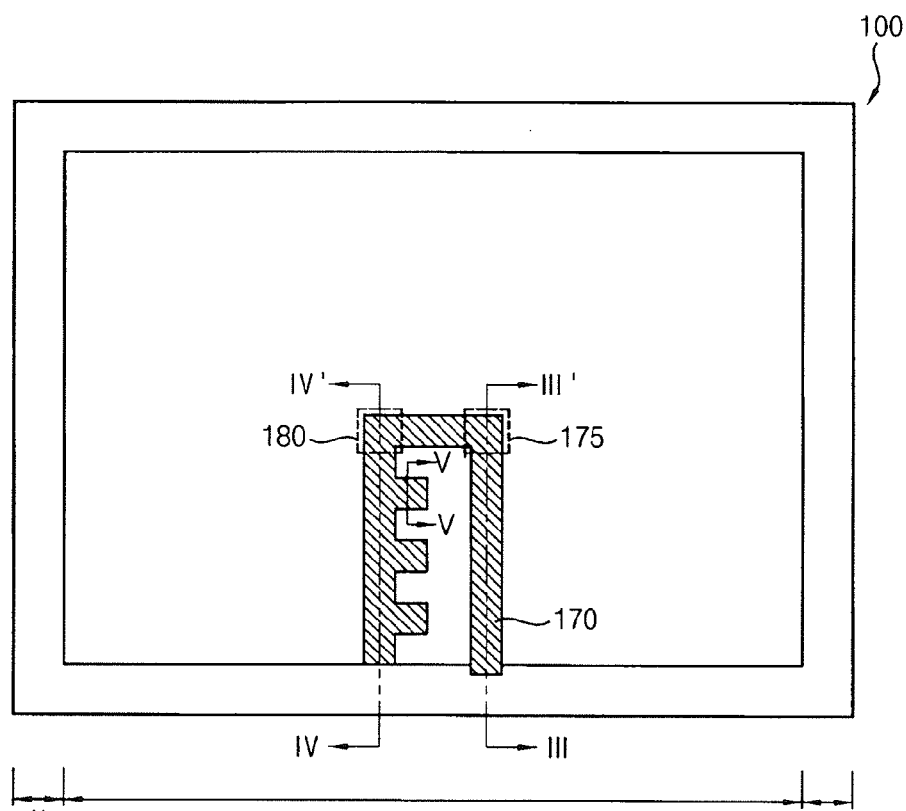
FIG. 4 is a plan view illustrating an organic light emitting display device in accordance with example embodiments.
Figure 5:
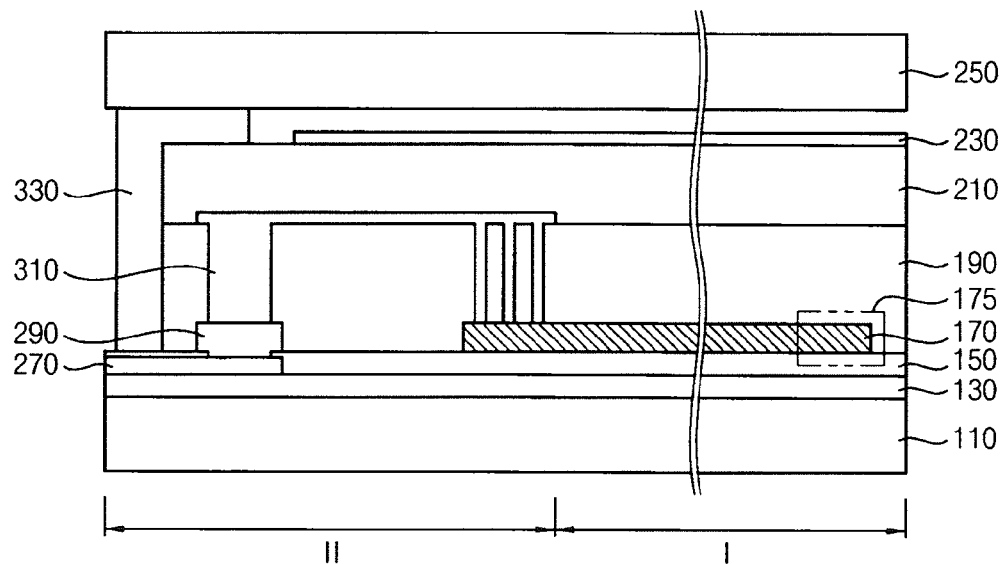
FIG. 5 is a cross sectional view illustrating an organic light emitting display device taken along a line III-III' of FIG. 4.
Figure 6:
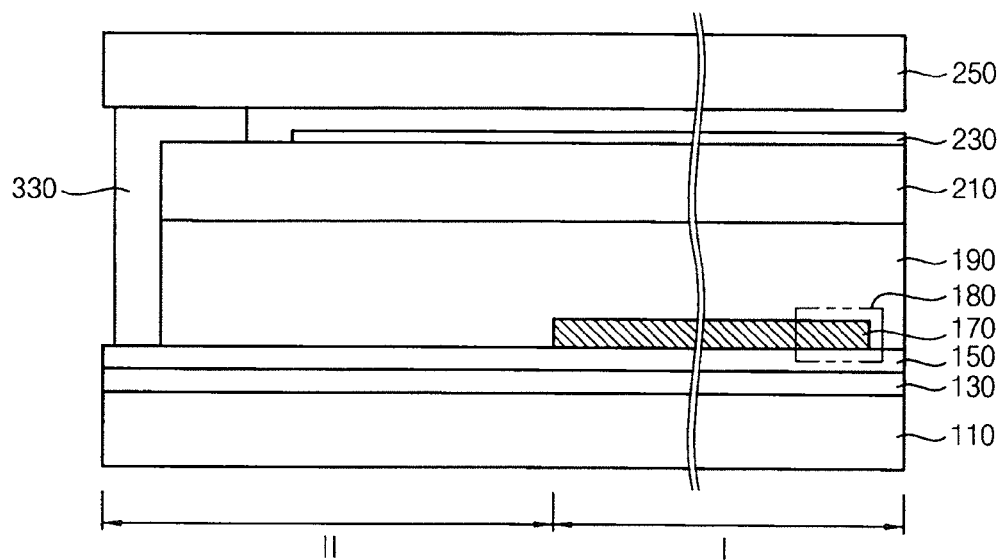
FIG. 6 is a cross sectional view illustrating an organic light emitting display device taken along a line IV-IV' of FIG. 4.
Figure 7:
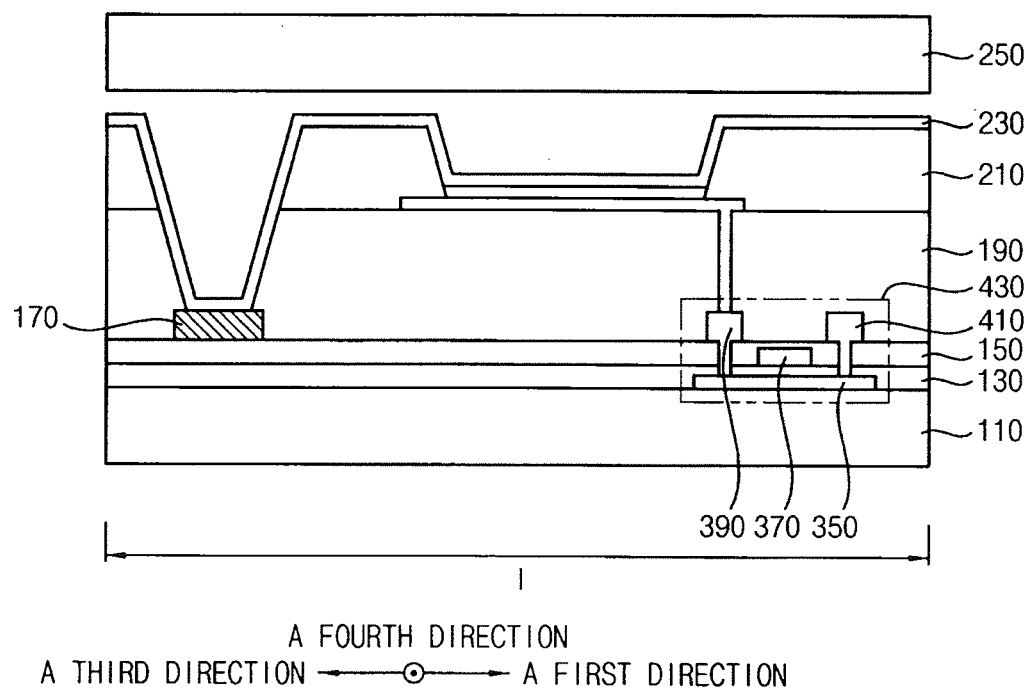
FIG. 7 is a cross sectional view illustrating an organic light emitting display device taken along a line V-V' of FIG. 4.

FIG. 4 is a plan view illustrating an organic light emitting display device in accordance with example embodiments, and FIG. 5 is a cross sectional view illustrating an organic light emitting display device taken along a line III-III' of FIG. 4. FIG. 6 is a cross sectional view illustrating an organic light emitting display device taken along a line IV-IV' of FIG. 4, and FIG. 7 is a cross sectional view illustrating an organic light emitting display device taken along a line V-V' of FIG. 4.

Referring to FIGS. 4 through 7, an organic light emitting display (OLED) device 100 may include a display region I and a peripheral region II. An array of a plurality of pixels may be located in the display region I. The peripheral region II may substantially surround the display region I. Common lines (e.g., data lines, scan lines, power lines, etc.) and a sealant may be located in the peripheral region II.

The OLED device 100 according to example embodiments may include a substrate 110 including a major surface, a first insulating layer 130, a second insulating layer 150, a third insulating layer 190, a fourth insulating layer 210, a first power line 170, a first connection line 270, a second connection line 290, a third connection line 310, a driving transistor 430, a first electrode 240, a light emitting layer 220, a second electrode 230, an encapsulation substrate 250, a sealant 330, etc. Here, the driving transistor 430 may include an active layer 350, a gate electrode 370, a source electrode 390, and a drain electrode 410. In embodiments, the first, second and third connection lines 270, 290 and 210 may form a power supply terminal.

In example embodiments, when viewed in a viewing direction perpendicular to the major surface, the first power line 170 may include a first extension, a second extension, a third extension, and a plurality of fourth extensions. The first extension may extend along a first direction from the peripheral region II to the display region I. For example, the first extension may extend to a center portion 20 of the display region I (refer to FIG. 1). The second extension may extend along a second direction in an end portion of the first extension extending in the first direction. Here, the second direction is substantially perpendicular to the first direction. The third extension may extend along a third direction in an end portion of the second extension extending in the second direction. Here, the third direction is substantially opposite to the first direction (e.g., the third direction is perpendicular to the second direction). In addition, the third extension and the first extension may be disposed in parallel to each other. The fourth extensions may extend from the third extension along a fourth direction. Here, the fourth direction is substantially perpendicular to the first direction and third direction, and is generally paralleled to the second direction. In addition, the fourth extensions and the second extension may be disposed in parallel to each other. Some pixels of array may be located on the fourth extension. The fourth extension may be electrically connected to the pixels (e.g., the second electrode 230). Here, the fourth extensions may be spaced from each other, and apart from the first extension. That is, the fourth extension may not be directly contacted to the first extension. Further, the first through fourth extensions may be disposed at the same level, and may be integrally formed. Accordingly, the OLED device 100 may serve as a display device having the display region I in which a uniform luminance by using the second electrode 230 and the first power line 170 is provided.

The substrate 110 may include transparent materials. For example, the substrate 110 may include a glass substrate, a quartz substrate, a synthetic quartz substrate, a calcium fluoride substrate, a fluoride-doping quartz substrate, a sodalime substrate, non-alkali substrate etc. As the OLED device 100 includes the display region I and the peripheral region II, the substrate 110 may include the display region I and the peripheral region II. Alternatively, the substrate 110 may include a flexible transparent resin substrate. Here, the flexible transparent resin substrate for the substrate 110 may include a polyimide substrate. For example, the polyimide substrate may include a first polyimide layer, a barrier film layer, a second polyimide layer, etc. In some example embodiments, the substrate 110 may have a structure in which the first polyimide layer, the barrier film layer and the second polyimide layer are stacked on a glass substrate. Here, after an insulation layer is provided on the second polyimide layer, a light emitting structure (e.g., the driving transistor 430, the first electrode 240, the light emitting layer 220, the second electrode 230, etc.) may be disposed on the insulation layer. After the light emitting structure is formed on the insulation layer, the glass substrate may be removed. It may be difficult that the light emitting structure is directly formed on the polyimide substrate because the polyimide substrate is thin and flexible. Accordingly, the light emitting structure is formed on a rigid glass substrate, and then the polyimide substrate may be used as the substrate 110 after a removal of the glass substrate.

The active layer 350 may be disposed in the display region I of the substrate 110. The active layer 350 may include an oxide semiconductor, an inorganic semiconductor (e.g., amorphous silicon, polysilicon, etc.), an organic semiconductor, etc.

The first insulating layer 130 may be disposed on the active layer 350. The first insulating layer 130 may cover the active layer 350, and may extend into the peripheral region II. That is, the first insulating layer 130 may be entirely disposed in the display region I and the peripheral region II. For example, the first insulating layer 130 may include a silicon compound, a metal oxide, etc.

The gate electrode 370 and the first connection line 270 may be disposed on the first insulating layer 130. In example embodiments, the gate electrode 370 may be disposed on the first insulating layer 130 under which the active layer 350 is located. That is, the gate electrode 370 may be located in the display region I. The first connection line 270 may be located in the peripheral region II. A low power supply voltage ELVSS that is provided from a power supply unit may be applied to the first connection line 270. Each of the gate electrode 370 and the first connection line 270 may include metal, alloy, metal nitride, conductive metal oxide, transparent conductive materials, etc. That is, the gate electrode 370 and the first connection line 270 may be disposed at the same level, and may include the same materials. In addition, the gate electrode 370 and the first connection line 270 may be simultaneously formed.

The second insulating layer 150 may be disposed on the first insulating layer 130, the gate electrode 370, and the first connection line 270. The second insulating layer 150 may cover the gate electrode 370 and the first connection line 270, and may extend into the peripheral region II. That is, the second insulating layer 150 may be entirely disposed in the display region I and the peripheral region II. For example, the second insulating layer 150 may include a silicon compound, a metal oxide, etc.

The source electrode 390, the drain electrode 410, the first power line 170, and the second connection line 290 may be disposed on the second insulating layer 150. In example embodiments, the source electrode 390 may be disposed in a first portion of the active layer 350 by removing a first portion of the first and second insulating layers 130 and 150. The drain electrode 410 may be disposed in a second portion of the active layer 350 by removing a second portion of the first and second insulating layers 130 and 150. Each of the source electrode 390 and the drain electrode 410 may be disposed in the display region I. In addition, the second connection line 290 may be contacted to the first connection line 270 by removing a portion of the second insulating layer 150, and may be disposed in the peripheral region II.

The first power line 170 illustrated in FIG. 5 may be the first extension of the first power line 170. The first extension may be disposed in a portion of the peripheral region II and the display region I. As described above, the first extension of the first power line 170 may extend to the center portion of the display region I along the first direction. Here, the first extension of the first power line 170 extending to the center portion may not be contacted to the second electrode 230. For example, the low power supply voltage ELVSS applied to the first connection line 270 may be passed to a first end of the first extension of the first power line 170 via the second connection line 290 and the third connection line 310. The low power supply voltage ELVSS passed to the first end of the first extension of the first power line 170 may be transferred to a second end 175 of the first extension of the first power line 170. Here, the low power supply voltage ELVSS may not be applied to the second electrode 230.

As illustrated in FIG. 4, the second extension of the first power line 170 may extend along the second direction from the second end 175 of the first extension. For example, a first end of the second extension of the first power line 170 may be connected to the second end 175 of the first extension of the first power line 170. In addition, a second end of the second extension of the first power line 170 extending in the second direction may be connected to a first end of the third extension of the first power line 170.

The first power line 170 illustrated in FIG. 6 may be the third extension of the first power line 170. The third extension may be disposed in the display region I. As described above, the third extension of the first power line 170 may extend along the third direction in the second end 180 of the second extension of the first power line 170. Here, the third extension extending along the third direction may not be contacted to the second electrode 230. For example, the low power supply voltage ELVSS applied to the first connection line 270 may be passed to the first end of the first extension of the first power line 170 via the second connection line 290 and the third connection line 310. The low power supply voltage ELVSS passed to the first end of the first extension of the first power line 170 may be transferred to the second end 175 of the first extension of the first power line 170. The low power supply voltage ELVSS passed to the second end 175 of the first extension of the first power line 170 may be passed from the first end of the second extension of the first power line 170 to the second end 180 of the second extension of the first power line 170. In addition, the low power supply voltage ELVSS passed to the second end 180 of the second extension of the first power line 170 may be transferred from a first end of the third extension of the first power line 170 to a second end of the third extension of the first power line 170. Here, the low power supply voltage ELVSS may not be applied to the second electrode 230.

The first power line 170 illustrated in FIG. 7 may be the fourth extension of the first power line 170. The fourth extension may be disposed in the display region I. As described above, the fourth extension of the first power line 170 may extend along the fourth direction in the third extension of the first power line 170. The fourth extension may substantially have a protruding shape. Here, at least a portion of the fourth extension extending along the fourth direction may be exposed via an opening (e.g., a contact hole) formed by removing at least a portion of the third and fourth insulating layers 190 and 210, and may be contacted to the second electrode 230. That is, the at least a portion of the fourth extension and the second electrode 230 may be electrically connected via the opening. For example, the low power supply voltage ELVSS applied to the first connection line 270 may be passed to the third extension of the first power line 170 via the second connection line 290, third connection line 310, the first extension of the first power line 170, and the second extension of the first power line 170. The low power supply voltage ELVSS passed to the third extension of the first power line 170 may be transferred from the third extension of the first power line 170 to the fourth extension of the first power line 170. In addition, the low power supply voltage ELVSS passed to the fourth extension of the first power line 170 may be provided to the second electrode 230. Accordingly, the low power supply voltage ELVSS may be provided to the second electrode 230 via the contact hole of the fourth extension of the first power line 170 adjacent to the center portion of the display region I. The low power supply voltage ELVSS may be provided to the second electrode 230 via a plurality of the contact holes of the fourth extension that are spaced apart from each other by a predetermined distance along the third direction. That is, the low power supply voltage ELVSS may be applied from the center portion to a first portion 10 (refer to FIG. 1) in the third direction. When the OLED device 100 has a top emitting structure, the second electrode 230 may be thinly disposed. As the OLED device 100 becomes larger, the second electrode 230 may be contacted to the first power line 170 so as to compensate an IR drop. Here, compared to a thickness of the second electrode 230, the first power line 170 may have a relatively thick thickness. Accordingly, the OLED device 100 may provide a uniform luminance to the display region I using the second electrode 230 and the first power line 170.

Each of the source electrode 390, the drain electrode 410, the first power line 170, and the second connection line 290 may include metal, alloy, metal nitride, conductive metal oxide, transparent conductive materials, etc. For example, the source electrode 390, the drain electrode 410, the first power line 170, and the second connection line 290 may include aluminum alloy, aluminum nitride (AlNx), silver alloy, tungsten nitride (WNx), copper alloy, chrome nitride (CrNx), molybdenum alloy, titanium nitride (TiNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a combination thereof. That is, the source electrode 390, the drain electrode 410, the first power line 170, and the second connection line 290 may be disposed at the same level, and may include the same materials. In addition, the source electrode 390, the drain electrode 410, the first power line 170, and the second connection line 290 may be simultaneously formed.

As illustrated in FIG. 4, the OLED device 100 includes one first power line 170 in the display region I, but the OLED device 100 may also include a plurality of first power lines 170 that are continuously disposed in the column and/or row directions.

The third insulating layer 190 may be disposed on the source electrode 390, the drain electrode 410, the first power line 170, the second connection line 290, and the second insulating layer 150. The third insulating layer 190 may cover the source electrode 390, the drain electrode 410, the first power line 170, and the second connection line 290, and extend into peripheral region II. That is, the third insulating layer 190 may be entirely disposed in the display region I and the peripheral region II. For example, the third insulating layer 190 may include organic insulating materials or inorganic insulating materials.

The third connection line 310 and the first electrode 240 may be disposed on the third insulating layer 190. In example embodiments, the third connection line 310 may be contacted to the second connection line 290 by removing a portion of the third insulating layer 190, and may extend along the first direction in the peripheral region II. The third connection line 310 extending along the first direction may be contacted to a first end of the first extension of the first power line 170 by removing a portion of the third insulating layer 190. As described above, the second connection line 290 may apply the low power supply voltage ELVSS to the third connection line 310, and then the third connection line 310 may apply the low power supply voltage ELVSS to the first end of the first extension of the first power line 170. The first electrode 240 may be contacted to the source electrode 390 (or the drain electrode 410) by removing a portion of the third insulating layer 190. The third connection line 310 and the first electrode 240 may include metal, alloy, metal nitride, conductive metal oxide, transparent conductive materials, etc. These may be used alone or in a combination thereof. That is, the third connection line 310 and the first electrode 240 may be disposed at the same level, and may include the same materials. In addition, the third connection line 310 and the first electrode 240 may be simultaneously formed.

The fourth insulating layer 210 may be disposed on the third insulating layer 190, the third connection line 310, and the first electrode 240. The fourth insulating layer 210 may cover the third connection line 310 and the first electrode 240, and may extend into the peripheral region II. That is, the fourth insulating layer 210 may be entirely disposed in the display region I and the peripheral region II. In example embodiments, the fourth insulating layer 210 may cover opposite side portions of the first electrode 240 to expose a portion of the first electrode 240 in the display region I. For example, the fourth insulating layer 210 may be a pixel defining layer. The fourth insulating layer 210 may include organic materials or inorganic materials.

The light emitting layer 220 may be disposed on the first electrode 240. The light emitting layer 220 may be formed using light emitting materials capable of generating different colors of light (e.g., a red color of light, a blue color of light, and a green color of light). Alternately, the light emitting layer 220 may generally generate a white color of light by stacking a plurality of light emitting materials capable of generating different colors of light such as a red color of light, a green color of light, a blue color of light, etc.

The second electrode 230 may be disposed on the fourth insulating layer 210, the light emitting layer 220, and the fourth extension of the first power line 170. The second electrode 230 may be disposed as a substantially uniform thickness along a profile of the fourth insulating layer 210. Here, the second electrode 230 may be entirely disposed in the display region I and the peripheral region II. In example embodiments, an opening removed a portion of the third and fourth insulating layers 190 and 210 in a portion under which the fourth extension of the first power line 170 in the display region I is disposed may be located. The second electrode 230 may extend on a sidewall of the opening, and then may be contacted to the fourth extension of the first power line 170. For example, the second electrode 230 may include metal, alloy, metal nitride, conductive metal oxide, transparent conductive materials, etc.

The encapsulation substrate 250 may be disposed on the second electrode 230. The encapsulation substrate 250 may include transparent materials. For example, the encapsulation substrate 250 may include a glass substrate, a quartz substrate, a synthetic quartz substrate, a calcium fluoride substrate, a fluoride-doping quartz substrate, a sodalime substrate, non-alkali substrate etc. In some example embodiments, the encapsulation substrate 250 may include a transparent inorganic material or flexible plastic. For example, the encapsulation substrate 250 may include a flexible transparent resin substrate. In this case, to increase flexibility of the OLED device 100, the encapsulation substrate 250 may include a stacked structure where at least one organic layer and at least one inorganic layer are alternately stacked. Alternately, a polarizer, a touch screen panel, etc. may be additionally disposed on the encapsulation substrate 250.

The sealant 330 may be disposed between the substrate 110 and the encapsulation substrate 250 in the peripheral region II. The sealant 330 may include frit and the like. In some example embodiments, the sealant 330 may additionally include a photo curable material. For example, a laser may be irradiated in the peripheral region II where the sealant 330 is located. In the laser irradiation, a phase of the sealant 330 may be changed from a solid phase to a liquid phase, and then the sealant 330 in the liquid phase may be cured to the solid phase after a predetermined time. In accordance with the phase change of the sealant 330, the encapsulation substrate 250 may be combined with the substrate 110 to seal the encapsulation substrate 250 relative to the substrate 110.

The OLED device 100 according to example embodiments may include the first power line 170 having the first through fourth extensions capable of passing the low power supply voltage ELVSS. Accordingly, the low power supply voltage ELVSS may be transferred in the directions from the center portion 20 of the display region I to the first portion 10 or to the second portion 30. As a result, the OLED device 100 may have a uniform luminance in the display region by using the second electrode 230 and the first power line 170.

Figure 8:
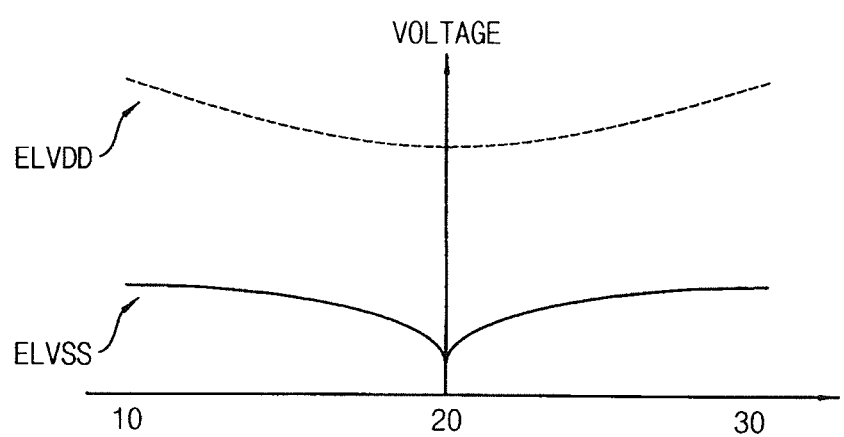
FIG. 8 is a graph illustrating an example of a high power supply voltage and a low power supply voltage applied to an organic light emitting display device of FIG. 4.

FIG. 8 is a graph illustrating an example of a high power supply voltage and a low power supply voltage applied to an organic light emitting display device of FIG. 4. A vertical axis of FIG. 8 is a magnitude of a voltage level, and a horizontal axis is a first portion 10, a center portion 20, and a second portion 30 of a display region I illustrated in FIG. 1. Referring to FIGS. 4 and 8, in embodiments, a high power supply voltage ELVDD may be simultaneously applied to the first portion 10 and the second portion 30 through a first power supply terminal located between the first portion 10 and the bottom edge of the substrate and a second power supply terminal located between the first portion 10 and the top edge of the substrate. Meanwhile, a low power supply voltage ELVSS may be applied to the central portion 20 through a third power supply terminal located between the first portion 10 and the bottom edge of the substrate and the power line 170. In embodiments, the power supply terminals may have configurations of power input terminals disclosed in U.S. Application Publication No. 2008/0252203. The content of U.S. Application Publication No. 2008/0252203 is incorporated herein by reference.

Referring to FIG. 8, when a low power supply voltage ELVSS is provided to an organic light emitting display (OLED) device 100 by a method illustrated in FIGS. 4 through 6, a voltage level of the low power supply voltage ELVSS may be increased by an IR drop in a direction from a center portion 20 of a display region I to first and second portions 10 and 30 of the display region I. Here, a structure of the first power line 170 in the display region I may be substantially symmetric to each other with respect to the center portion 20. Meanwhile, a voltage level of a high power supply voltage ELVDD may be decreased by the IR drop in a direction from the first and second portions 10 and 30 of the display region I to the center portion 20. Here, a line structure transferring the high power supply voltage ELVDD may be a dual bank structure. That is, the high power supply voltage ELVDD may be simultaneously applied to the first and second portions 10 and 30 of the display region I. As illustrated in FIG. 8, the low power supply voltage ELVSS may have a low voltage level in the center portion 20, and may have a high voltage level in the first portion 10 and the second portion 30. In addition, the high power supply voltage ELVDD may have a low voltage level in the center portion 20, and may have a high voltage level in the first portion 10 and the second portion 30.

Figure 9:
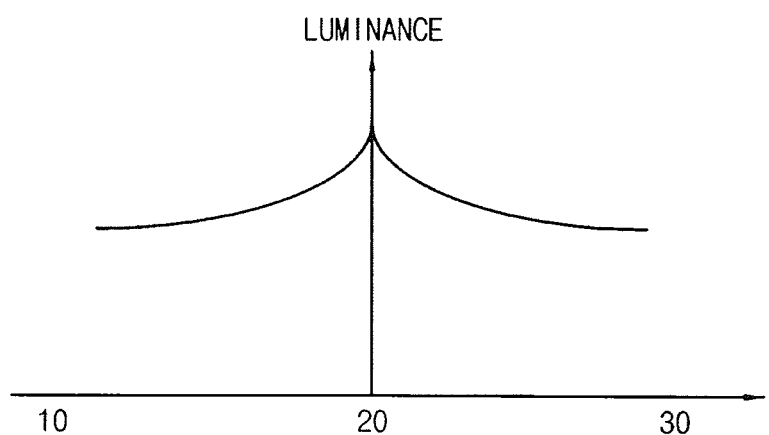
FIG. 9 is a graph illustrating an example of a luminance of an organic light emitting display device of FIG. 4.

FIG. 9 is a graph illustrating an example of a luminance of an organic light emitting display device of FIG. 4. A vertical axis of FIG. 9 is a magnitude of a luminance level, and a horizontal axis is a first portion 10, a center portion 20, and a second portion 30 of a display region I illustrated in FIG. 1.

Referring to FIG. 9, when the organic light emitting display (OLED) device 100 is driven by a digital driving method, a difference of a high power supply voltage ELVDD and a low power supply voltage ELVSS may be defined as a luminance. A luminance of a center portion 20 of a display region I may be somewhat higher than a luminance of first and second portion 10 and 30 of the display region I. Here, a slope of the center portion 20 of the display region I may be controlled by a timing control unit. For example, the timing control unit may decrease the luminance difference between the first and second portion 10 and 30 of the display region I and the center portion 20 of the display region I. Also, a shape of a luminance graph in the center portion 20 of the display region I may convert a sharp shape to a round shape. In this case, it may improve a problem where an afterimage of an image sticking pattern is remained in the first and second portion 10 and 30 of the display region I. In addition, when a user of the OLED display device 100 may watch a movie by a wide screen method, the first and second portion 10 and 30 of the display region I which are low luminance regions may be black color, and the center portion 20 of the display region I which is a high luminance region may display an image. Thus, in this case, the OLED display device 100 may be efficiently operated. Accordingly, the OLED device 100 may have the display region I in which a uniform luminance is provided.

FIGS. 10A through 10H are cross sectional views illustrating a method of manufacturing an organic light emitting display device in accordance with example embodiments.

Figure 10A:
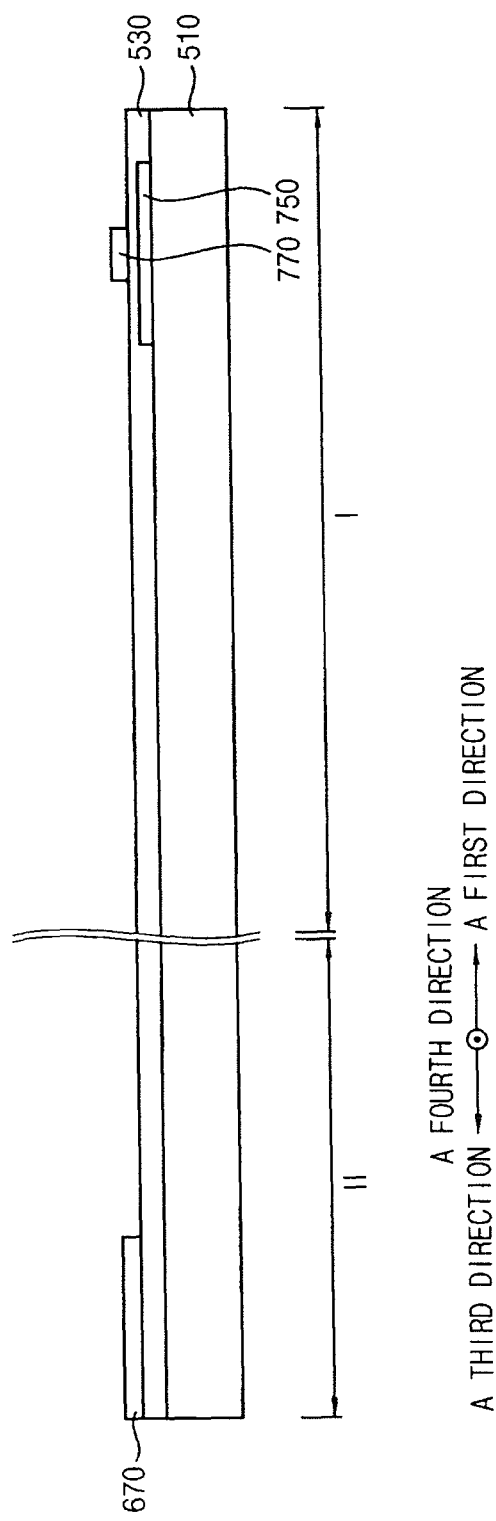

Referring to FIG. 10A, an active layer 750 may be formed in a display region I of a substrate 510. The substrate 510 may be formed using transparent materials. For example, the substrate 510 may include a glass substrate, a quartz substrate, a synthetic quartz substrate, a calcium fluoride substrate, a fluoride-doping quartz substrate, a sodalime substrate, non-alkali substrate etc. In some example embodiments, the substrate 510 may include a flexible transparent resin substrate. For example, the flexible transparent resin substrate for the substrate 510 may be formed using a polyimide substrate. The active layer 750 may be formed using an oxide semiconductor, an inorganic semiconductor (e.g., amorphous silicon, polysilicon, etc.), an organic semiconductor, etc.

A first insulating layer 530 may be formed on the substrate 510. The first insulating layer 530 may cover the active layer 750, and may extend from the display region I into the peripheral region II. For example, the first insulating layer 530 may be formed of a silicon compound, a metal oxide, etc.

A gate electrode 770 and a first connection line 670 may be formed on the first insulating layer 130. In example embodiments, the first connection line 670 may be located in the peripheral region II, and the gate electrode 770 may be formed on the first insulating layer 530 under which the active layer 750 is located. For example, each of the gate electrode 770 and the first connection line 670 may be formed using metal, alloy, metal nitride, conductive metal oxide, transparent conductive materials, etc. That is, the gate electrode 770 and the first connection line 670 may be formed at the same level, and may be simultaneously formed using the same materials.

Figure 10B:
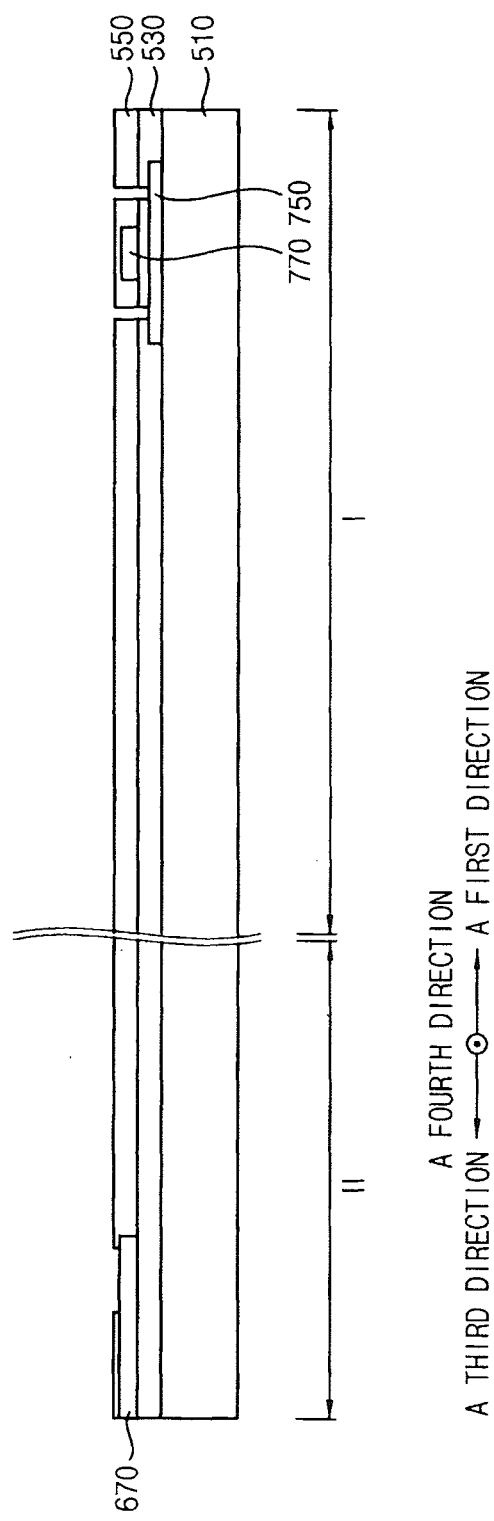

Referring to FIG. 10B, a second insulating layer 550 may be formed on the first insulating layer 530. The second insulating layer 550 may cover the gate electrode 770, and may extend from the display region I into the peripheral region II. After the second insulating layer 550 is formed on the first insulating layer 530, a first contact hole may be formed in a first portion of the active layer 750 by removing a first portion of the first and second insulating layers 530 and 550, and a second contact hole may be formed in a second portion of the active layer 750 by removing a second portion of the first and second insulating layers 530 and 550. In addition, an opening exposing at least a portion of the first connection line 670 in the peripheral region II may be formed. For example, the second insulating layer 550 may be formed using a silicon compound, a metal oxide, etc.

Figure 10C:
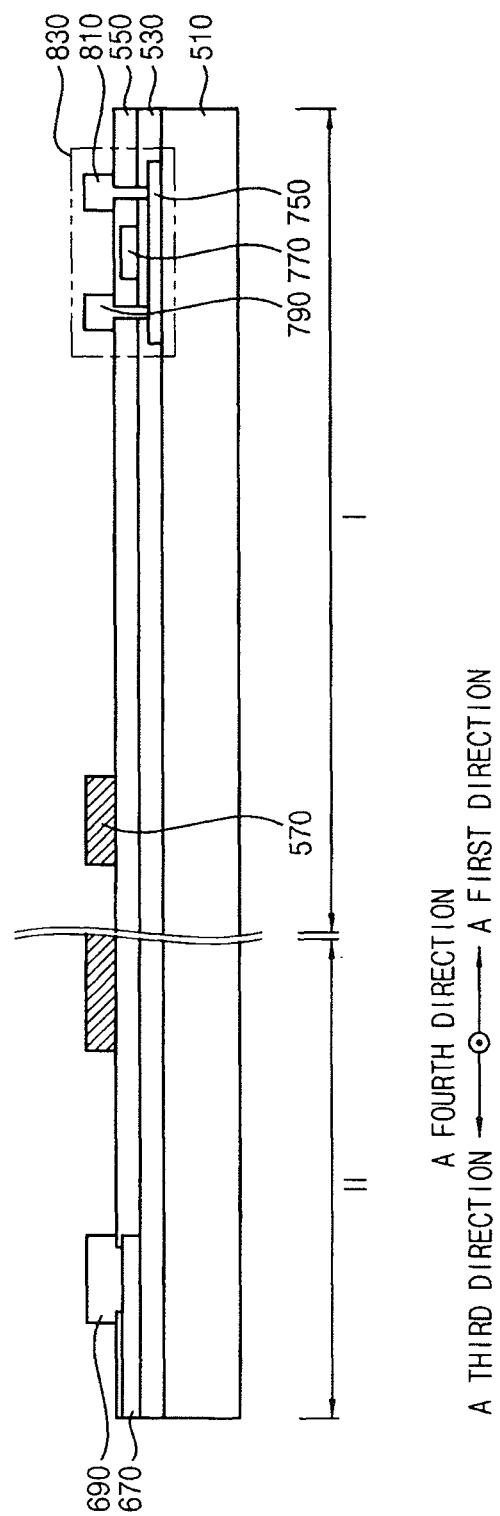

Referring to FIG. 10C, a second connection line 690, a first power line 570, a source electrode 790, and a drain electrode 810 may be formed on the second insulating layer 550. In example embodiments, the second connection line 690 may be located in the peripheral region II. The second connection line 690 may fill the opening, and may be contacted to the first connection line 670. The source electrode 790 may fill the first contact hole. The source electrode 790 may extend into the first contact hole, and may be contacted to the first end of the active layer 750. The drain electrode 810 may fill the second contact hole. The drain electrode 810 may extend into the second contact hole, and may be contacted to the second portion of the active layer 750. In this way, a driving transistor having the source electrode 790, the drain electrode 810, the gate electrode 770, and the active layer 750 may be formed.

In example embodiments, the first power line 570 may include first through fourth extensions. The first power line 570 illustrated in the peripheral region II may be the first extension of the first power line 170. The first power line 570 illustrated in the display region I may be the fourth extension of the first power line 570 (refer to FIGS. 4 through 7). The first extension may be formed in a portion of the peripheral region II and the display region I. The first extension of the first power line 570 may extend to a center portion of the display region I along a first direction. The second extension of the first power line 570 may be formed adjacent to the center portion of the display region I. The second extension of the first power line 570 may extend along a second direction in a second end of the first extension of the first power line 570. For example, a first end of the second extension of the first power line 570 may be connected to the second end of the first extension of the first power line 570. In addition, a second end of the second extension of the first power line 570 extending in the second direction may be connected to a first end of the third extension. The third extension of the first power line 570 may be formed in the display region I. As a described above, the third extension of the first power line 570 may extend along a third direction in the second end of the second extension of the first power line 570. The fourth extension of the first power line 570 may be formed in the display region I. The fourth extension of the first power line 170 may extend along a fourth direction in the third extension of the first power line 570. The fourth extension may substantially have a protruding shape in the fourth direction from the third extension.

Each of the second connection line 690, the first power line 570, the source electrode 790, and the drain electrode 810 may be formed using metal, alloy, metal nitride, conductive metal oxide, transparent conductive materials, etc. For example, the second connection line 690, the first power line 570, the source electrode 790, and the drain electrode 810 may be formed using aluminum alloy, AlNx, silver alloy, WNx, copper alloy, CrNx, molybdenum alloy, TiNx, TaNx, SRO, ZnOx, ITO, SnOx, InOx, GaOx, IZO, etc. These may be used alone or in a combination thereof. That is, the second connection line 690, the first power line 570, the source electrode 790, and the drain electrode 810 may be formed at the same level, and may be simultaneously formed using the same materials.

Figure 10D:
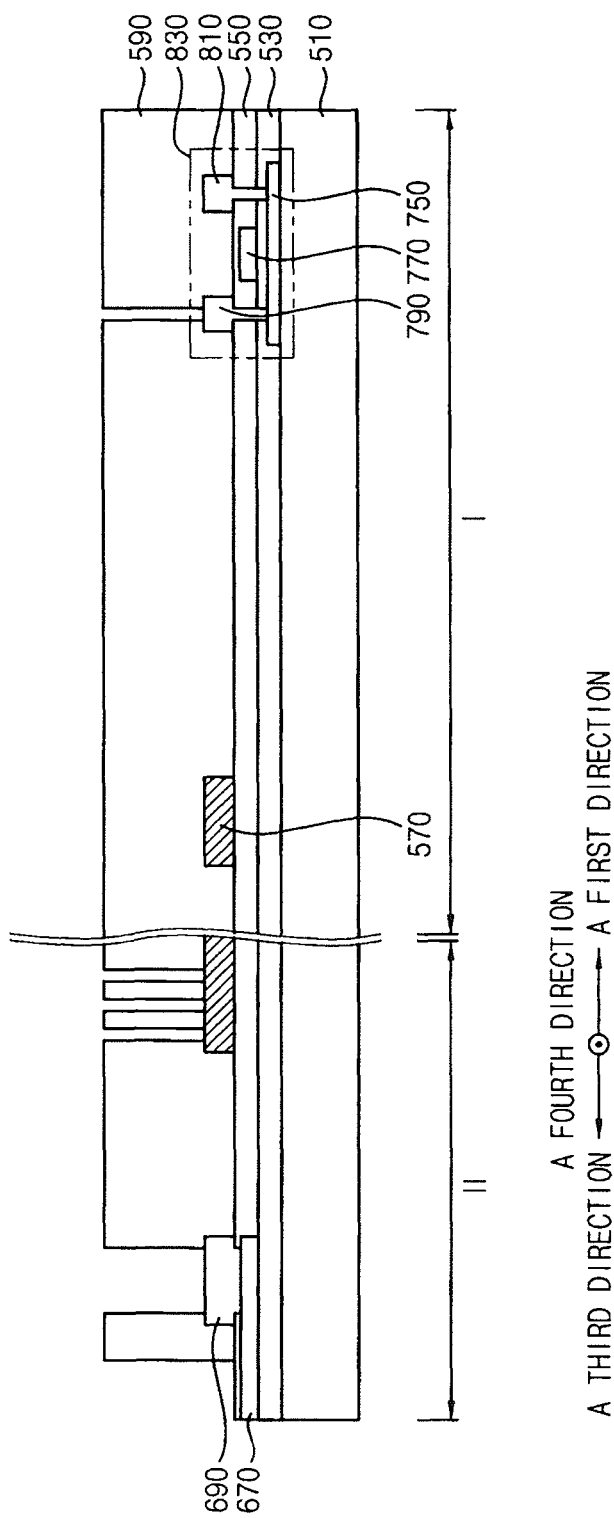

Referring to FIG. 10D, a third insulating layer 590 may be formed on the second connection line 690, the first power line 570, the source electrode 790, and the drain electrode 810. The third insulating layer 590 may cover the second connection line 690, the first power line 570, the source electrode 790, and the drain electrode 810, may extend into the peripheral region II. That is, the third insulating layer 590 may be entirely formed in the display region I and the peripheral region II. For example, the third insulating layer 590 may be formed using organic insulating materials or inorganic insulating materials.

Referring to FIG. 10E, a third connection line 710 and a first electrode 640 may be formed on the third insulating layer 590. In example embodiments, the third connection line 710 may be contacted to the second connection line 690 by removing a portion of the third insulating layer 590, and may extend along the first direction in the peripheral region II. The third connection line 710 extending along the first direction may be contacted to a first end of the first extension of the first power line 570 by removing a portion of the third insulating layer 590. The first electrode 640 may be contacted to the source electrode 790 (or the drain electrode 810) by removing a portion of the third insulating layer 590. The third connection line 710 and the first electrode 640 may include metal, alloy, metal nitride, conductive metal oxide, transparent conductive materials, etc. These may be used alone or in a combination thereof. That is, the third connection line 710 and the first electrode 640 may be formed at the same level, and may be simultaneously formed using the same materials.

Figure 10F:
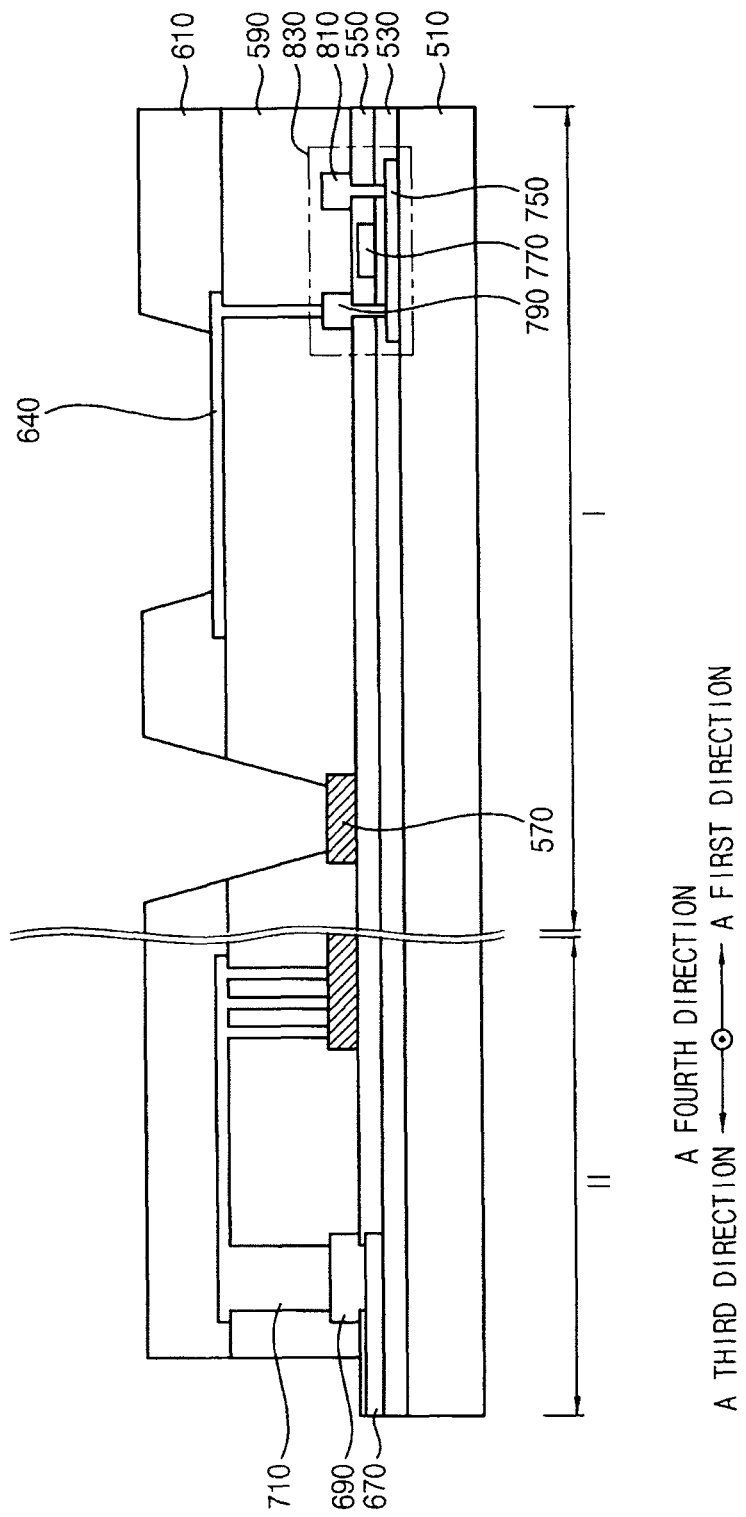

Referring to FIG. 10F, a fourth insulating layer 610 may be formed on the third insulating layer 590, the third connection line 710, and the first electrode 640. The fourth insulating layer 610 may cover the third connection line 710 and the first electrode 640, and may extend into the peripheral region II. That is, the fourth insulating layer 610 may be entirely formed in the display region I and the peripheral region II. In example embodiments, the fourth insulating layer 610 may cover opposite side portions of the first electrode 640 to expose a portion of the first electrode 640 in the display region I. In addition, a portion of the fourth extension extending along the fourth direction via an opening formed by removing at least a portion of the third and fourth insulating layers 590 and 610 may be exposed. For example, the fourth insulating layer 610 may be a pixel defining layer. The fourth insulating layer 610 may be formed using organic materials or inorganic materials.

Figure 10G:
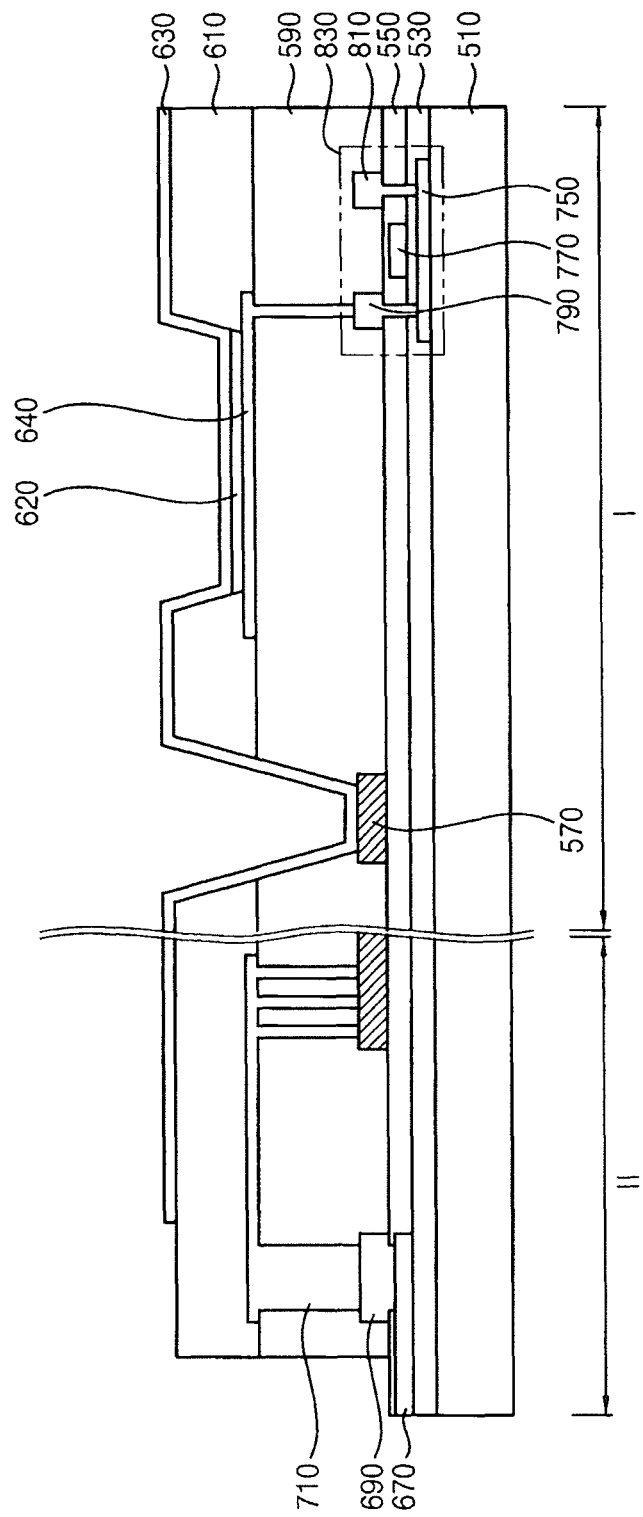

Referring to FIG. 10G, a light emitting layer 620 may be formed on the first electrode 640. The light emitting layer 620 may be formed using light emitting materials capable of generating different colors of light (e.g., a red color of light, a blue color of light, and a green color of light). Alternately, the light emitting layer 620 may generally generate a white color of light by stacking a plurality of light emitting materials capable of generating different colors of light such as a red color of light, a green color of light, a blue color of light, etc.

A second electrode 630 may be formed on the fourth insulating layer 610, the light emitting layer 620, and the fourth extension of the first power line 570. The second electrode 630 may be formed as a substantially uniform thickness along a profile of the fourth insulating layer 610. Here, the second electrode 630 may be entirely formed in the display region I and the peripheral region II. In example embodiments, an opening removed a portion of the third and fourth insulating layers 590 and 610 in a portion under which the fourth extension of the first power line 170 in the display region I is formed may be located. The second electrode 630 may extend on a sidewall of the opening, and then may be contacted to the fourth extension of the first power line 570.

In embodiments, the first, second and third connection lines 670, 690 and 710 may form a power supply terminal, and a low power supply voltage applied to the first connection line 670 may be passed to the third extension of the first power line 570 via the second connection line 690, third connection line 710, the first extension of the first power line 570, and the second extension of the first power line 570. The low power supply voltage passed to the third extension of the first power line 570 may be transferred from the third extension of the first power line 570 to the fourth extension of the first power line 570. In addition, the low power supply voltage passed to the fourth extension of the first power line 570 may be provided to the second electrode 630. Accordingly, the low power supply voltage may be provided to the second electrode 630 via the contact hole of the fourth extension of the first power line 570 adjacent to the center portion of the display region I. The low power supply voltage may be provided to the second electrode 630 via a plurality of the openings of the fourth extension that are spaced apart from each other by a predetermined distance along the third direction. That is, the low power supply voltage may be applied to pixels from the center portion to a first portion (refer to FIG. 1) in the third direction. For example, the second electrode 630 may be formed using metal, alloy, metal nitride, conductive metal oxide, transparent conductive materials, etc.

Referring to FIG. 10H, an encapsulation substrate 650 may be formed on the second electrode 630. The encapsulation substrate 650 may be formed using transparent materials. For example, the encapsulation substrate 650 may include a glass substrate, a quartz substrate, a synthetic quartz substrate, a calcium fluoride substrate, a fluoride-doping quartz substrate, a sodalime substrate, non-alkali substrate etc. In some example embodiments, the encapsulation substrate 650 may be formed using a transparent inorganic material or flexible plastic. For example, the encapsulation substrate 250 may include a flexible transparent resin substrate. In this case, to increase flexibility of the organic light emitting display device, the encapsulation substrate 650 may include a stacked structure where at least one organic layer and at least one inorganic layer are alternately stacked. Alternately, a polarizer, a touch screen panel, etc. may be additionally formed on the encapsulation substrate 650.

A sealant 730 may be formed between the substrate 510 and the encapsulation substrate 650 in the peripheral region II. The sealant 730 may be formed using frit and the like. In some example embodiments, the sealant 730 may additionally include a photo curable material. For example, a laser may be irradiated in the peripheral region II where the sealant 730 is located. In the laser irradiation, a phase of the sealant 730 may be changed from a solid phase to a liquid phase, and then the sealant 730 in the liquid phase may be cured to the solid phase after a predetermined time. In accordance with the phase change of the sealant 730, the encapsulation substrate 650 may be combined with the substrate 510 to seal the encapsulation substrate 650 relative to the substrate 510.

Figure 11:
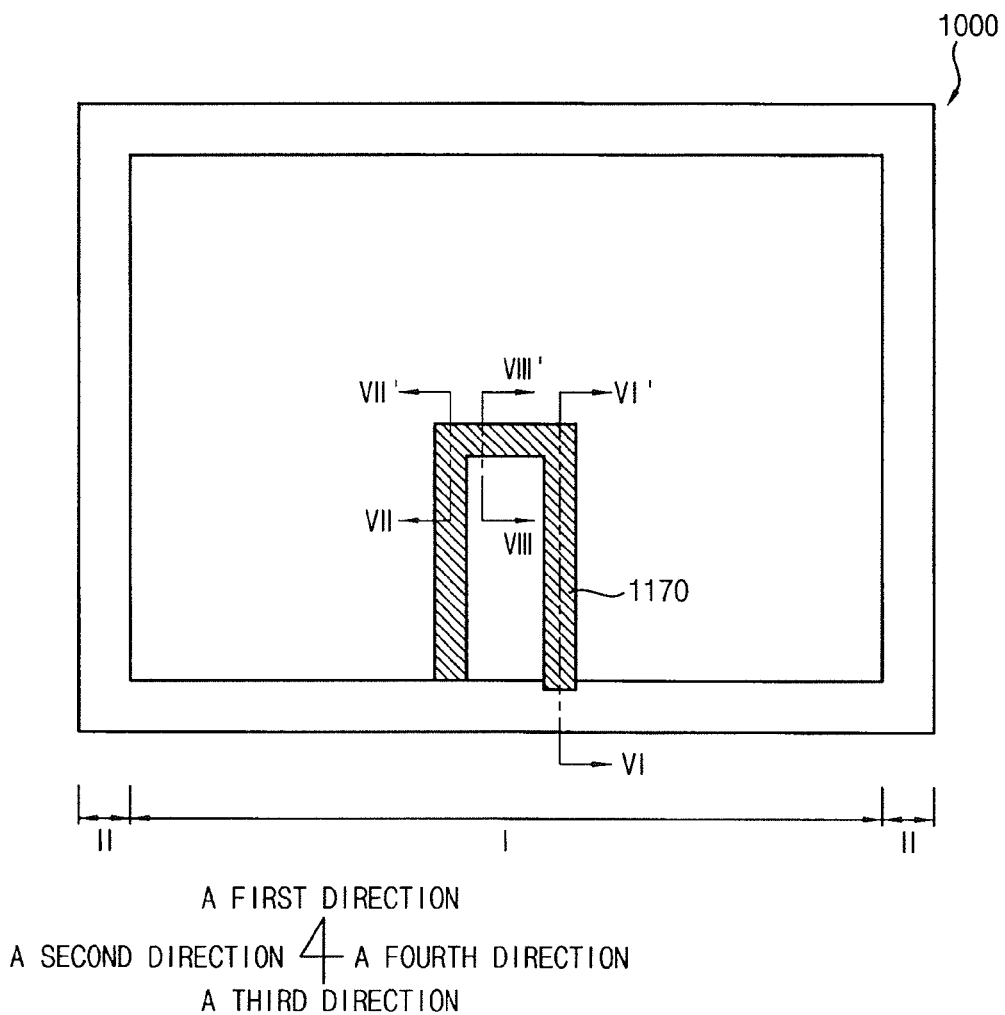
FIG. 11 is a plan view illustrating an organic light emitting display device in accordance with some example embodiments.
Figure 12:
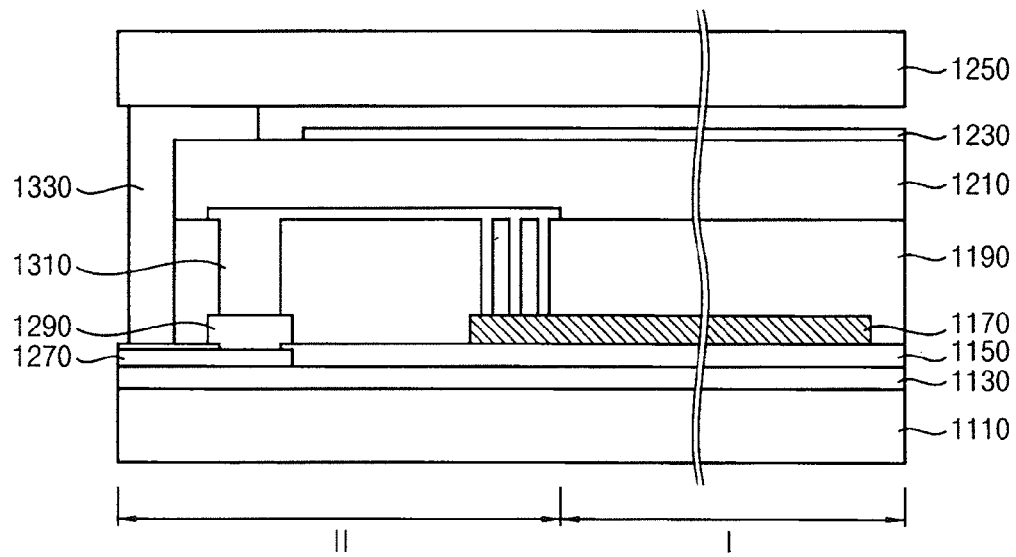
FIG. 12 is a cross sectional view illustrating an organic light emitting display device taken along a line VI-VI' of FIG. 11.
Figure 13:
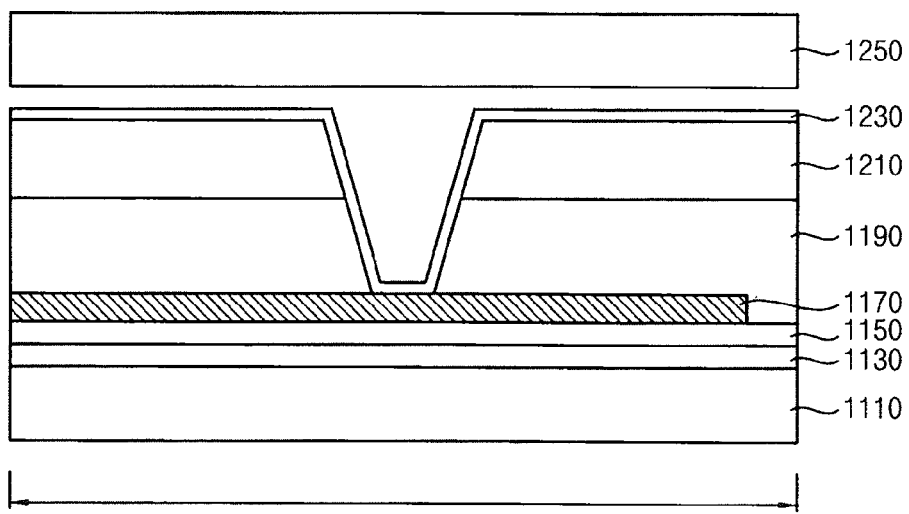
FIG. 13 is a cross sectional view illustrating an organic light emitting display device taken along a line VII-VII' of FIG. 11.
Figure 14:
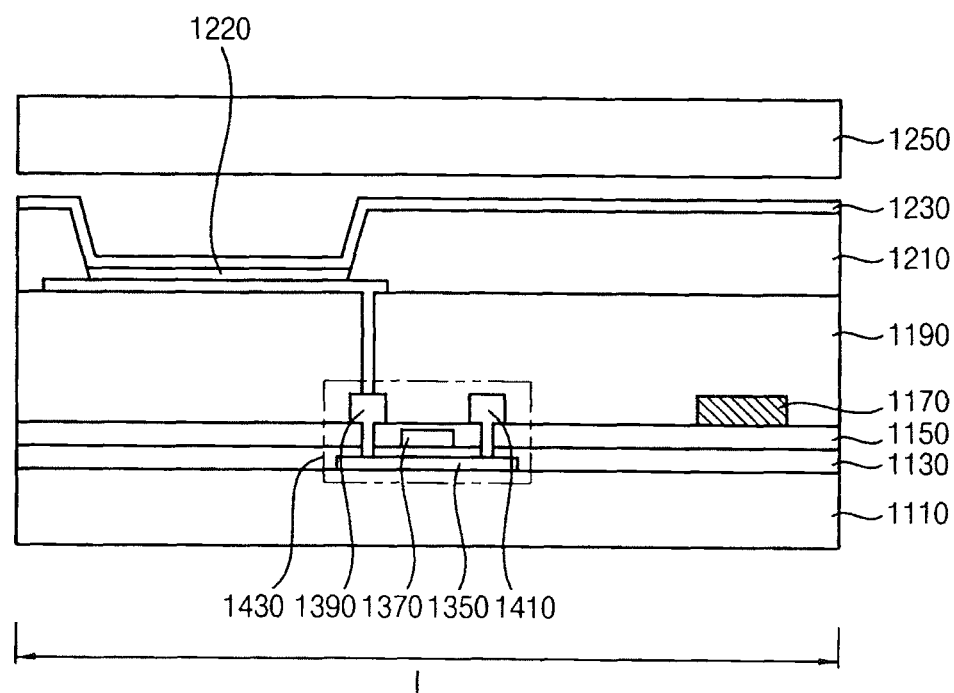
FIG. 14 is a cross sectional view illustrating an organic light emitting display device taken along a line VIII-VIII' of FIG. 11.

FIG. 11 is a plan view illustrating an organic light emitting display device in accordance with some example embodiments, and FIG. 12 is a cross sectional view illustrating an organic light emitting display device taken along a line VI-VI' of FIG. 11. FIG. 13 is a cross sectional view illustrating an organic light emitting display device taken along a line VII-VII' of FIG. 11, and FIG. 14 is a cross sectional view illustrating an organic light emitting display device taken along a line VIII-VIII' of FIG. 11.

Referring to FIGS. 11 through 14, an organic light emitting display (OLED) device 1000 may include a display region I and a peripheral region II. A plurality of pixels may be located in the display region I. The peripheral region II may substantially surround the display region I. Common lines and a sealant may be located in the peripheral region II.

The OLED device 1000 according to example embodiments may include a substrate 1110, a first insulating layer 1130, a second insulating layer 1150, a third insulating layer 1190, a fourth insulating layer 1210, a first power line 1170, a first connection line 1270, a second connection line 1290, a third connection line 1310, a driving transistor 1430, a first electrode 1240, a light emitting layer 1220, a second electrode 1230, an encapsulation substrate 1250, a sealant 1330, etc. Here, the driving transistor 1430 may include an active layer 1350, a gate electrode 1370, a source electrode 1390, and a drain electrode 1410. In embodiments, the first, second and third connection lines 1270, 1290 and 1310 may form a power supply terminal.

In example embodiments, the first power line 1170 may include a first extension, a second extension, and a third extension. The first extension may extend along a first direction from the peripheral region II to the display region I. For example, the first extension may extend to a center portion 20 of the display region I (refer to FIG. 1). The second extension may extend along a second direction in an end portion of the first extension extending in the first direction. Here, the second direction is substantially perpendicular to the first direction. The third extension may extend along a third direction in an end portion of the second extension extending in the second direction. Here, the third direction is substantially opposite to the first direction (e.g., the third direction is perpendicular to the second direction). In addition, the third extension and the first extension may be disposed in parallel to each other. The third extension located adjacent to the pixels may be electrically connected to the second electrode 1230. Here, the third extension may be spaced apart from the first extension. That is, the third extension may not be directly contacted to the first extension. Further, the first through third extensions may be disposed at the same level, and may be integrally formed. Accordingly, the OLED device 1000 may serve as a display device having the display region I in which a uniform luminance by using the second electrode 1230 and the first power line 1170 is provided.

The substrate 1110 may include transparent materials. For example, the substrate 1110 may include a glass substrate, a quartz substrate, a synthetic quartz substrate, a calcium fluoride substrate, a fluoride-doping quartz substrate, a sodalime substrate, non-alkali substrate etc. As the OLED device 1000 includes the display region I and the peripheral region II, the substrate 1110 may include the display region I and the peripheral region II. Alternatively, the substrate 1110 may include a flexible transparent resin substrate. Here, the flexible transparent resin substrate for the substrate 1110 may include a polyimide substrate.

The active layer 1350 may be disposed in the display region I of the substrate 1110. The active layer 1350 may include an oxide semiconductor, an inorganic semiconductor (e.g., amorphous silicon, polysilicon, etc.), an organic semiconductor, etc.

The first insulating layer 1130 may be disposed on the active layer 1350. The first insulating layer 1130 may cover the active layer 1350, and may extend into the peripheral region II. That is, the first insulating layer 1130 may be entirely disposed in the display region I and the peripheral region II. For example, the first insulating layer 1130 may include a silicon compound, a metal oxide, etc.

The gate electrode 1370 and the first connection line 1270 may be disposed on the first insulating layer 1130. In example embodiments, the gate electrode 1370 may be disposed on the first insulating layer 1130 under which the active layer 1350 is located. That is, the gate electrode 1370 may be located in the display region I. The first connection line 1270 may be located in the peripheral region II. A low power supply voltage ELVSS that is provided from a power supply unit may be applied to the first connection line 1270. Each of the gate electrode 1370 and the first connection line 1270 may include metal, alloy, metal nitride, conductive metal oxide, transparent conductive materials, etc. That is, the gate electrode 1370 and the first connection line 1270 may be disposed at the same level, and may include the same materials. In addition, the gate electrode 1370 and the first connection line 1270 may be simultaneously formed.

The second insulating layer 1150 may be disposed on the first insulating layer 1130, the gate electrode 1370, and the first connection line 1270. The second insulating layer 1150 may cover the gate electrode 1370 and the first connection line 1270, and may extend into the peripheral region II. That is, the second insulating layer 1150 may be entirely disposed in the display region I and the peripheral region II. For example, the second insulating layer 1150 may include a silicon compound, a metal oxide, etc.

The source electrode 1390, the drain electrode 1410, the first power line 1170, and the second connection line 1290 may be disposed on the second insulating layer 1150. In example embodiments, the source electrode 1390 may be disposed in a first portion of the active layer 1350 by removing a first portion of the first and second insulating layers 1130 and 1150. The drain electrode 1410 may be disposed in a second portion of the active layer 1350 by removing a second portion of the first and second insulating layers 1130 and 1150. Each of the source electrode 1390 and the drain electrode 1410 may be disposed in the display region I. In addition, the second connection line 1290 may be contacted to the first connection line 1270 by removing a portion of the second insulating layer 1150, and may be disposed in the peripheral region II.

The first power line 1170 illustrated in FIG. 12 may be the first extension of the first power line 1170. The first extension may be disposed in a portion of the peripheral region II and the display region I. As described above, the first extension of the first power line 1170 may extend to the center portion of the display region I along the first direction. Here, the first extension of the first power line 1170 extending to the center portion may not be contacted to the second electrode 1230. For example, the low power supply voltage ELVSS applied to the first connection line 1270 may be passed to a first end of the first extension of the first power line 1170 via the second connection line 1290 and the third connection line 1310. The low power supply voltage ELVSS passed to the first end of the first extension of the first power line 1170 may be transferred to a second end 175 of the first extension of the first power line 1170. Here, the low power supply voltage ELVSS may not be applied to the second electrode 1230.

As illustrated in FIG. 11, the second extension of the first power line 1170 may extend along the second direction in the second end of the first extension. For example, a first end of the second extension of the first power line 1170 may be connected to the second end of the first extension of the first power line 1170. In addition, a second end of the second extension of the first power line 1170 extending in the second direction may be connected to a first end of the third extension of the first power line 1170. The first power line 1170 illustrated in FIG. 14 may be the second extension of the first power line 1170. The second extension may be disposed adjacent to the center portion of the display region I.

The first power line 1170 illustrated in FIG. 13 may be the third extension of the first power line 1170. The third extension may be disposed in the display region I. As described above, the third extension of the first power line 1170 may extend along the third direction in the second end of the second extension of the first power line 1170. Here, at least a portion of the third extension extending along the third direction via an opening (e.g., a contact hole) formed by removing at least a portion of the third and fourth insulating layers 1190 and 1210 may be exposed, and may be contacted to the second electrode 230 via the opening. That is, the at least a portion of the third extension and the second electrode 1230 may be electrically connected via the opening.

For example, the low power supply voltage ELVSS applied to the first connection line 1270 may be passed to the first end of the first extension of the first power line 1170 via the second connection line 1290 and third connection line 1310. The low power supply voltage ELVSS passed to the first end of the first extension of the first power line 1170 may be transferred to the second end of the first extension of the first power line 1170. The low power supply voltage ELVSS passed to the second end of the first extension of the first power line 1170 may be transferred from the first end of the second extension of the first power line 1170 to the second end of the second extension of the first power line 1170. In addition, the low power supply voltage ELVSS passed to the second end of the second extension of the first power line 1170 may be transferred from the first end of the third extension of the first power line 1170 to the second end of the third extension of the first power line 1170. The low power supply voltage ELVSS may be provided to the second electrode 1230. Accordingly, the low power supply voltage ELVSS may be provided to the second electrode 1230 via the contact hole of the third extension of the first power line 1170 adjacent to the center portion of the display region I. The low power supply voltage ELVSS may be provided to the second electrode 230 via a plurality of the contact holes of the third extension that are spaced apart from each other by a predetermined distance along the third direction. That is, the low power supply voltage ELVSS may be applied from the center portion to a first portion 10 (refer to FIG. 1) in the third direction. When the OLED device 1000 has a top emitting structure, the second electrode 1230 may be thinly disposed. As the OLED device 1000 becomes larger, the second electrode 1230 may be contacted to the first power line 1170 so as to compensate an IR drop. Here, compared to a thickness of the second electrode 1230, the first power line 1170 may have a relatively thick thickness. Accordingly, the OLED device 1000 may provide a uniform luminance to the display region I using the second electrode 1230 and the first power line 1170.

Each of the source electrode 1390, the drain electrode 1410, the first power line 1170, and the second connection line 1290 may include metal, alloy, metal nitride, conductive metal oxide, transparent conductive materials, etc. For example, the source electrode 1390, the drain electrode 1410, the first power line 1170, and the second connection line 1290 may include aluminum alloy, AlNx, silver alloy, WNx, copper alloy, CrNx, molybdenum alloy, TiNx, TaNx, SRO, ZnOx, ITO, SnOx, InOx, GaOx, IZO, etc. These may be used alone or in a combination thereof. That is, the source electrode 1390, the drain electrode 1410, the first power line 1170, and the second connection line 1290 may be disposed at the same level, and may include the same materials. In addition, the source electrode 1390, the drain electrode 1410, the first power line 1170, and the second connection line 1290 may be simultaneously formed.

As illustrated in FIG. 11, the OLED device 1000 includes one first power line 1170 in the display region I, but the OLED device 1000 may also include a plurality of first power lines 1170 that are continuously disposed in the column and/or row directions.

The third insulating layer 1190 may be disposed on the source electrode 1390, the drain electrode 1410, the first power line 1170, the second connection line 1290, and the second insulating layer 1150. The third insulating layer 1190 may cover the source electrode 1390, the drain electrode 1410, the first power line 1170, and the second connection line 1290, and extend into peripheral region II. That is, the third insulating layer 1190 may be entirely disposed in the display region I and the peripheral region II. For example, the third insulating layer 1190 may include organic insulating materials or inorganic insulating materials.

The third connection line 1310 and the first electrode 1240 may be disposed on the third insulating layer 1190. In example embodiments, the third connection line 1310 may be contacted to the second connection line 1290 by removing a portion of the third insulating layer 1190, and may extend along the first direction in the peripheral region II. The third connection line 1310 extending along the first direction may be contacted to the first end of the first extension of the first power line 1170 by removing a portion of the third insulating layer 1190. As described above, the second connection line 1290 may apply the low power supply voltage ELVSS to the third connection line 1310, and then the third connection line 310 may apply the low power supply voltage ELVSS to the first side of the first extension of the first power line 1170. The first electrode 1240 may be contacted to the source electrode 1390 (or the drain electrode 1410) by removing a portion of the third insulating layer 1190. The third connection line 1310 and the first electrode 1240 may include metal, alloy, metal nitride, conductive metal oxide, transparent conductive materials, etc. These may be used alone or in a combination thereof. That is, the third connection line 1310 and the first electrode 1240 may be disposed at the same level, and may include the same materials. In addition, the third connection line 1310 and the first electrode 240 may be simultaneously formed.

The fourth insulating layer 1210 may be disposed on the third insulating layer 1190, the third connection line 1310, and the first electrode 1240. The fourth insulating layer 1210 may cover the third connection line 1310 and the first electrode 1240, and may extend into the peripheral region II. That is, the fourth insulating layer 1210 may be entirely disposed in the display region I and the peripheral region II. In example embodiments, the fourth insulating layer 1210 may cover opposite side portions of the first electrode 1240 to expose a portion of the first electrode 1240 in the display region I. For example, the fourth insulating layer 1210 may be a pixel defining layer. The fourth insulating layer 1210 may include organic materials or inorganic materials.

The light emitting layer 1220 may be disposed on the first electrode 1240. The light emitting layer 1220 may be formed using light emitting materials capable of generating different colors of light (e.g., a red color of light, a blue color of light, and a green color of light). Alternately, the light emitting layer 1220 may generally generate a white color of light by stacking a plurality of light emitting materials capable of generating different colors of light such as a red color of light, a green color of light, a blue color of light, etc.

The second electrode 1230 may be disposed on the fourth insulating layer 1210, the light emitting layer 1220, and the fourth extension of the first power line 1170. The second electrode 1230 may be disposed as a substantially uniform thickness along a profile of the fourth insulating layer 1210. Here, the second electrode 1230 may be entirely disposed in the display region I and the peripheral region II. In example embodiments, an opening removed a portion of the third and fourth insulating layers 1190 and 1210 in a portion under which the third extension of the first power line 1170 in the display region I is disposed may be located. The second electrode 1230 may extend on a sidewall of the opening, and then may be contacted to the third extension of the first power line 1170. For example, the second electrode 1230 may include metal, alloy, metal nitride, conductive metal oxide, transparent conductive materials, etc.

The encapsulation substrate 1250 may be disposed on the second electrode 1230. The encapsulation substrate 1250 may include transparent materials. For example, the encapsulation substrate 1250 may include a glass substrate, a quartz substrate, a synthetic quartz substrate, a calcium fluoride substrate, a fluoride-doping quartz substrate, a sodalime substrate, non-alkali substrate etc. In some example embodiments, the encapsulation substrate 1250 may include a transparent inorganic material or flexible plastic. For example, the encapsulation substrate 1250 may include a flexible transparent resin substrate. In this case, to increase flexibility of the OLED device 1000, the encapsulation substrate 1250 may include a stacked structure where at least one organic layer and at least one inorganic layer are alternately stacked. Alternately, a polarizer, a touch screen panel, etc. may be additionally disposed on the encapsulation substrate 1250.

The sealant 1330 may be disposed between the substrate 1110 and the encapsulation substrate 1250 in the peripheral region II. The sealant 1330 may include frit and the like. In some example embodiments, the sealant 1330 may additionally include a photo curable material.

The OLED device 1000 according to example embodiments may include the first power line 1170 having the first through third extensions capable of passing the low power supply voltage ELVSS. Accordingly, the low power supply voltage ELVSS may be transferred in the directions from the center portion of the display region I to the first portion or to the second portion. As a result, the OLED device 1000 may have a uniform luminance in the display region by using the second electrode 1230 and the first power line 1170.

Embodiments of the present invention may be applied to various display devices including an organic light display device. For example, the present may be applied to the mobile phone, the smart phone, the smart pad, the laptop computer, the tablet computer, the personal digital assistant (PDA), the portable multimedia player (PMP), the digital camera, the music player (e.g., a MP3 player), the portable game console, the navigation, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display device comprising:
   a substrate comprising a major surface;
   a display region and a peripheral region surrounding the display region when viewed in a viewing direction perpendicular to the major surface;
   an array of a plurality of pixels disposed in the display region; and
   a first power line extending from the peripheral region into the display region, the first power line being electrically connected to the array of pixels at a contact point in the display region,
   wherein, when viewed in the viewing direction, the first power line comprises:
   a first extension extending from the peripheral region to the display region;
   a second extension connected to the first extension;
   a third extension connected to the second extension and extending from a location in the display region toward the peripheral region; and
   a fourth extension connected to and protruding from the third extension when viewed in the viewing direction, the fourth extension comprising the contact point.

2. The organic light emitting display device of claim 1, wherein the first through third extensions of the first power line are disposed at the same level, and are integrally formed, wherein the third extension comprises one end which is not connected to a conductive line located in the same level, wherein the first extension and the third extension are substantially parallel to each other.

3. The organic light emitting display device of claim 1, wherein the first power line is connected to a power such that after a power supply voltage is transferred to a center of the display region via the first extension extending in a first direction, the power supply voltage is transferred via the third extension extending in a third direction from the center of the display region to the peripheral region.

4. The organic light emitting display device of claim 1, further comprising:
   a semiconductor element electrically connected to the pixel,
   wherein the semiconductor element includes at least one insulation layer, a gate electrode, an active layer, a source electrode, and a drain electrode.

5. The organic light emitting display device of claim 4, further comprising:
   a first connection line disposed over the substrate of the peripheral region,
   wherein the first connection line and the gate electrode are disposed at the same level, and
   wherein the first connection line and the gate electrode include the same materials.

6. The organic light emitting display device of claim 5, further comprising:
   a second connection line disposed over the first connection line in the peripheral region,
   wherein the second connection line, the source electrode, and the drain electrode are disposed at the same level, and
   wherein the second connection line, the source electrode, and the drain electrode include the same materials.

7. The organic light emitting display device of claim 6, further comprising:
   a third connection line disposed over the second connection line of the peripheral region,
   wherein the third connection line and the first electrode are disposed at the same level, and
   wherein the third connection line and the first electrode include the same materials.

8. The organic light emitting display device of claim 7, wherein the third connection line and at least a portion of the first extension of the first power line are electrically connected via an opening located in the at least one insulation layer.

9. The organic light emitting display device of claim 1, further comprising:
   an encapsulation substrate disposed over the pixels; and
   a sealant interconnecting the substrate and the encapsulation substrate.

10. The organic light emitting display device of claim 1, wherein when viewed in the viewing direction, the third extension does not extend to the peripheral region.

11. The organic light emitting display device of claim 1, wherein the first extension is connected with a power supply in the peripheral region when viewed in the viewing direction.

12. An organic light emitting display device comprising:
   a substrate comprising a major surface;
   a display region and a peripheral region surrounding the display region when viewed in a viewing direction perpendicular to the major surface;
   an array of a plurality of pixels disposed in the display region; and
   a first power line extending from the peripheral region into the display region, the first power line being electrically connected to the array of pixels at a contact point in the display region,
   wherein, when viewed in the viewing direction, the first power line comprises:
      a first extension extending from the peripheral region to the display region;
      a second extension connected to the first extension;
      a third extension connected to the second extension and extending from a location in the display region toward the peripheral region,
   wherein the first power line is connected to a power such that after a power supply voltage is transferred to a center of the display region via the first extension extending in a first direction, the power supply voltage is transferred via the third extension extending in a third direction from the center of the display region to the peripheral region,
   wherein at least one of the pixels is located between the first extension and the third extension when viewed in the viewing direction,
   wherein each of the pixels includes:
      a first electrode disposed in the display region of the substrate;
      a light emitting layer disposed on the first electrode;
      a second electrode disposed on the light emitting layer; and
      at least one insulation layer interposed between the first power line and the second electrode,
      wherein the second electrode extends through a through-hole formed through the at least one insulation layer and contacts the first power line at the contact point.

13. The organic light emitting display device of claim 12, wherein the first power line comprises a fourth extension connected to and protruded from the third extension when viewed in the viewing direction, and the fourth extension comprises the contact point, wherein the first through third extensions are electrically connected to the second electrode via the fourth extension.

14. An organic light emitting display device comprising:
   a substrate comprising a major surface;
   a display region and a peripheral region surrounding the display region when viewed in a viewing direction perpendicular to the major surface;
   an array of a plurality of pixels disposed in the display region; and
   a first power line extending from the peripheral region into the display region, the first power line being electrically connected to the array of pixels at a contact point in the display region,
   wherein, when viewed in the viewing direction the first power line comprises:
      a first extension extending from the peripheral to the display region;
      a second extension connected to the first extension; and
      a third extension connected to the second extension and extending from a location in the display region toward the peripheral region,
   wherein the substrate comprises a first edge and a second edge opposite to the first edge,
   wherein the array comprises a middle portion and peripheral portions, each of which is disposed between the middle portion and one of the first and second edges when viewed in the viewing direction,
   wherein the array comprises a plurality of pixel electrodes, a common electrode and a plurality of light emitting elements, each of which is disposed between one of the plurality of pixel electrodes and the common electrode,
   wherein the first power line is connected to a first power terminal located between the first edge and the array, and further connected to the common electrode at the contact point which is located generally in the middle portion of the array when viewed in the viewing direction,
   wherein the organic light emitting display device comprises a plurality of second power lines connected to second power terminals, each of which is disposed between the array and one of the first and second edges, the plurality of second power lines being connected to the plurality of pixel electrodes.

15. The organic light emitting display device of claim 14, wherein the first power line comprises another contact point located in one of the peripheral portions of the array when viewed in the viewing direction.

16. The organic light emitting display device of claim 14, further comprising additional first power lines, each of which has a contact point in the middle portion of the array.

17. The organic light emitting display device of claim 14, wherein pixels located in the middle portion have a luminance greater than that of pixels located in the peripheral portions.

18. The organic light emitting display device of claim 14, wherein when viewed in the viewing direction, the third extension comprises one end which is not connected to any conductive line or terminal.

19. The organic light emitting display device of claim 18, wherein when viewed in the viewing direction, the third extension extends from the middle portion to one of the peripheral portions.

* * * * *